(12) United States Patent
Matsuyoshi et al.

(10) Patent No.: US 6,833,758 B2
(45) Date of Patent: Dec. 21, 2004

(54) POWER AMPLIFIER

(75) Inventors: Toshimitsu Matsuyoshi, Katano (JP); Kaoru Ishida, Shijonawate (JP); Seiji Fujiwara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/446,055

(22) Filed: May 28, 2003

(65) Prior Publication Data

US 2003/0234688 A1 Dec. 25, 2003

(30) Foreign Application Priority Data

May 29, 2002 (JP) ...................................... 2002-156181

(51) Int. Cl.$^7$ ................................................. H03F 1/26
(52) U.S. Cl. ...................................... 330/149; 330/151
(58) Field of Search .............................. 330/149, 151, 330/279; 375/297; 455/63

(56) References Cited

U.S. PATENT DOCUMENTS 5,644,268 A * 7/1997 Hang .......................... 330/151
6,714,073 B2 * 3/2004 Suto et al. ................... 330/149
6,720,829 B2 * 4/2004 Matsuyoshi et al. ......... 330/149

FOREIGN PATENT DOCUMENTS

JP 2000-261252 9/2000

* cited by examiner

Primary Examiner—Henry Choe
(74) Attorney, Agent, or Firm—Wenderoth, Lind & Ponack, L.L.P.

(57) ABSTRACT

A power amplifier capable of compensating for distortion by pre-distortion and achieving a large distortion suppressing effect even if IM3L components and IM3U components occurring at the power amplifier have a large level difference. A power amplifying circuit 117 amplifies an original signal. An envelope detector 119 generates an envelope signal having components identical to envelope components included in the original signal. Based on the original signal a distortion signal generating circuit 112 generates a distortion signal for canceling distortion components occurring while the original signal is amplified by the power amplifying circuit 117. In a power combiner 116, the envelope signal is injected to the original signal, thereby eliminating the asymmetric characteristic of the distortion components. In the power amplifying circuit 117, the distortion signal is injected to the original signal, thereby suppressing the distortion components.

11 Claims, 14 Drawing Sheets

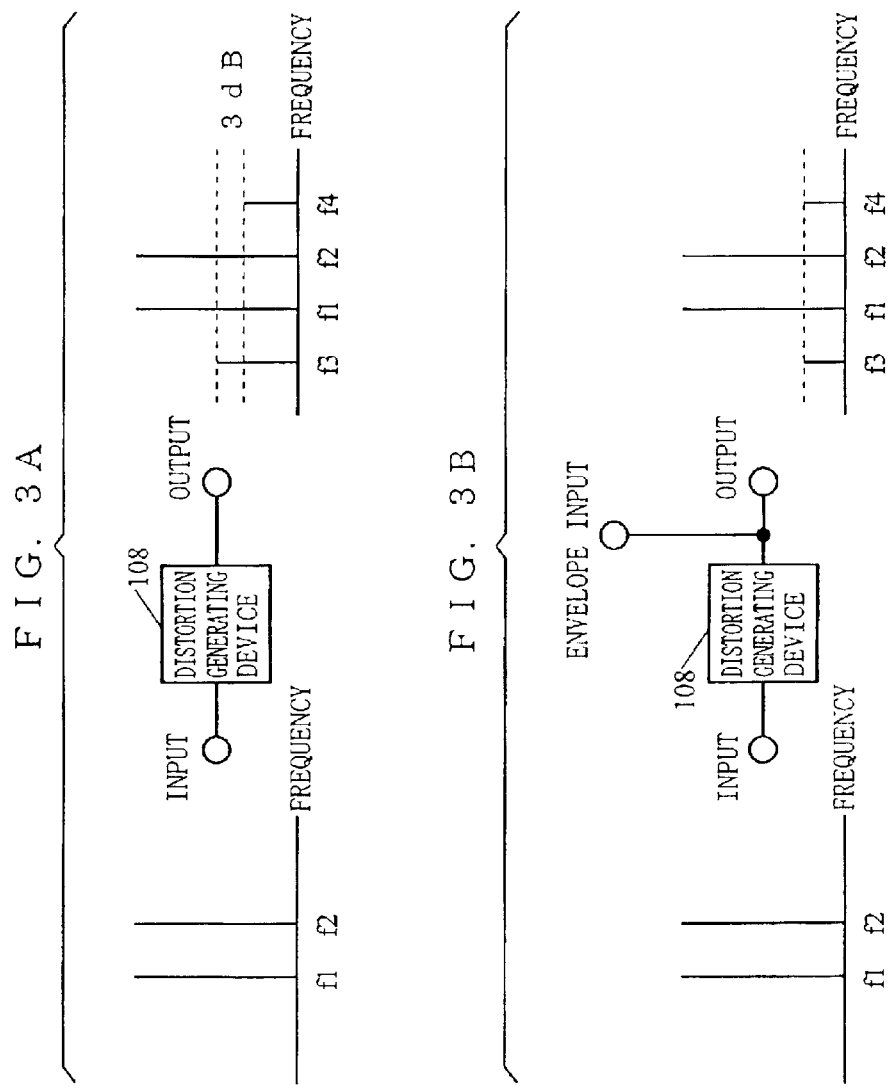

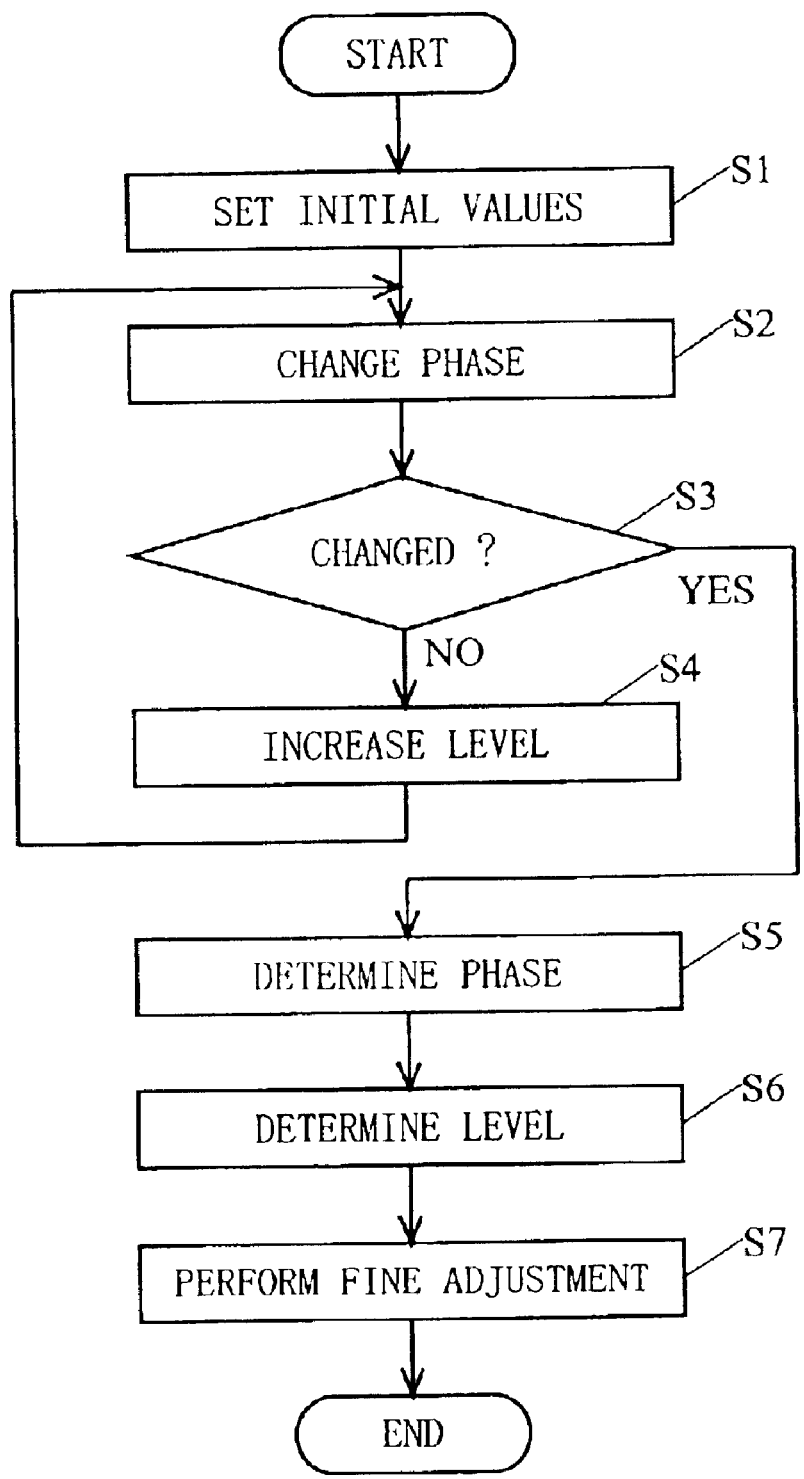
F I G. 9

POWER AMPLIFIER

BACKGROUND OF THE INVENTION

1. Field of the Invention

The present invention relates to power amplifiers and, more specifically, to a power amplifier capable of compensating for distortion occurring during signal amplification by pre-distortion.

2. Description of the Background Art

In recent years, mobile communications have required a transmitting apparatus located at a base station to collectively amplify a large number of signal channels. For this reason, a highly-efficient power amplifier with more linearity has been demanded. In order to increase the linearity of the power amplifier, adoption of a circuit for compensating for distortion, such as the one employing a pre-distortion scheme, is a requisite,.

FIG. 16 is a block diagram illustrating the configuration of a conventional power amplifier. The power amplifier illustrated in FIG. 16 includes an input terminal 601, an output terminal 602, a power splitter 603, a delay unit 604, a distortion generating circuit 605, a variable attenuator 606, a variable phase shifter 607, a power combiner 608, a power amplifying circuit 609, a directional coupler 610, and a control unit 611.

In the above-configured amplifier capable of compensating for distortion by pre-distortion, a carrier signal supplied through the input terminal 601 is split by the power splitter 603 into two carrier signals. Based on one of these two carrier signals, the distortion generating circuit 605 generates a distortion signal. This distortion signal is adjusted in amplitude and phase by the variable attenuator 606 and the variable phase shifter 607, respectively, and is then supplied to the power combiner 608. The other one of the two carrier signals obtained by the power splitter 603 is, on the other hand, delayed by the delay unit 604, and is then supplied to the power combiner 608. The power combiner 608 combines the distortion signal adjusted in amplitude and phase and the delayed carrier signal together for output to the power amplifying circuit 609. The signal output from the power combiner 608 is amplified by the power amplifying circuit 609, and is then output to outside of the power amplifier from the output terminal 602.

Provided between the power amplifying circuit 609 and the output terminal 602 is a directional coupler 610. The directional coupler 610 divides the signal output from the power amplifying circuit 609 into two signals, and one of these two signals is output to the control unit 611. The control unit 611 controls the variable attenuator 606 and the variable phase shifter 607 so that inter modulation distortion (hereinafter simply referred to as "distortion") occurring at the power amplifying circuit 609 while amplifying the carrier signal is equal in amplitude and opposite in phase to the distortion signal supplied to the power combiner 608.

As described above, in the conventional power amplifier capable of compensating for distortion by pre-distortion, the distortion signal is generated so as to be equal in amplitude and opposite in phase to the distortion signal occurring at the power amplifying circuit 609 while amplifying the carrier signal. Furthermore, the generated distortion signal is added in advance to the carrier signal to be supplied to the power amplifying circuit 609. That is, distortion components equal in amplitude and opposite in phase are injected to the input side of the amplifier. With this, the conventional power amplifier reduces the distortion occurring at the power amplifying circuit 609.

The conventional power amplifier illustrated in FIG. 16, however, has some problems as follows. In the distortion components occurring at the power amplifying circuit 609 (hereinafter referred to as "IM3 components"), if ternary distortion components occurring at a low frequency side (hereinafter referred to as "IM3L components") and ternary distortion components occurring at a high frequency side (hereinafter referred to as "IM3U components") have a significant level difference, it is impossible to sufficiently suppress both of these IM3L and IM3U components. This is because, if the distortion components (IM3L and IM3U components) have a large asymmetric characteristic as stated above, it is difficult for the distortion generating circuit 605 to generate a distortion signal which is equal in amplitude and opposite in phase to both of the IM3L and IM3U components.

SUMMARY OF THE INVENTION

Therefore, an object of the present invention is to provide a power amplifier capable of compensating for distortion by pre-distortion and achieving a large distortion suppressing effect even if IM3L components and IM3U components both occurring at the power amplifier have a large level difference.

The present invention has the following features to attain the object mentioned above.

A first aspect of the present invention is directed to a power amplifier which amplifies an original signal including a plurality of signals of different frequencies. The power amplifier includes:

a signal input section for inputting the original signal;

an amplifying section for amplifying the original signal input from the signal input section;

a signal output section for outputting the signal amplified by the amplifying section to outside of the power amplifier;

an envelope signal generating section for generating an envelope signal having components identical to envelope components included in the original signal;

a distortion signal generating section for generating, based on the original signal, a distortion signal for canceling distortion components occurring while the original signal is amplified by the amplifying section;

a first envelope signal injecting section for injecting the envelope signal to a signal amplifying route from the signal input section to the signal output section so as to eliminate an asymmetric characteristic of the distortion components; and a distortion signal injecting section for injecting the distortion signal to the signal amplifying route so as to suppress the distortion components.

In the above first aspect, the envelope signal can eliminate the asymmetric characteristic of the distribution components occurring at the power amplifier. Furthermore, the distortion signal can reduce the distortion components occurring at the power amplifier. That is to say, with the use of two signals, the envelope signal and the distortion signal, elimination of the asymmetric characteristic of the distortion component and reduction of the distortion components are performed individually. In a conventional method, it is impossible to generate a distortion signal which coincides with the asymmetric characteristic of the distortion components occurring at the amplifying section. Therefore, the distortion components having the asymmetric characteristic cannot be sufficiently suppressed. According to the first aspect, however, the asymmetric characteristic of the distortion components can be eliminated by the envelope signal. Thus, a large distortion suppressing effect can be achieved even with the use of a distortion signal which can be generated by the conventional method.

According to a second aspect based on the first aspect, the power amplifier further includes:

an envelope signal detecting section for detecting a level of the envelope signal; and a first envelope signal adjusting section for adjusting, based on the level of the envelope signal detected by the envelope signal detecting section, an amplitude and a phase of the envelope signal to be injected to the signal amplifying route.

In the above second aspect, the amplitude and phase of the envelope signal to be injected to the signal amplifying route are adjusted in accordance with the level of the envelope signal itself. Here, the level of the envelope signal is changed in accordance with the level of the original signal. Also, the amplitude and phase of the envelope signal to be injected is changed in accordance with the level of the original signal. In view of these, the amplitude and the phase of the envelope signal to be injected are adjusted based on the level of the envelope signal itself so as to have appropriate values, thereby more accurately eliminating the asymmetric characteristic of the distortion components. This makes it possible to achieve a larger distortion suppressing effect.

According to a third aspect based on the second aspect, the first envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion components is minimum, and adjusts the amplitude and the phase of the envelope signal by using the table.

In the above third aspect, with the use of the table provided in advance, the amplitude and phase of the envelope signal to be injected to the signal amplifying route can be easily determined.

According to a fourth aspect based on the first aspect, the power amplifier further includes a second envelope signal injecting section for injecting the envelope signal to a distortion signal generating route from the signal input section to the distortion signal injecting section so as to eliminate an asymmetric characteristic of frequency components included in the distortion signal that correspond to the distortion components.

In the above fourth aspect, the envelope signal can eliminate the asymmetric characteristic occurring in the frequency components of the distortion signal, that is, the level difference between the frequency components at the high frequency side and the frequency components at the low frequency side in the distortion signal. Here, an asymmetric characteristic occurs even in the distortion signal, although not being so large compared with the asymmetric characteristic in the distortion components occurring at the amplifying section. Further, in the present aspect, the asymmetric characteristic of the distortion components has been eliminated by the envelope signal. Therefore, it is preferable that the distortion signal for suppressing the distortion components whose asymmetric characteristic have already been eliminated should not have an asymmetric characteristic. In view of this, by also eliminating the asymmetric characteristic of the distortion signal, it is possible to suppress distortion more accurately.

According to a fifth aspect based on the fourth aspect, the power amplifier further includes:

an envelope signal detecting section for detecting a level of the envelope signal; and a second envelope signal adjusting section for adjusting, based on the level of the envelope signal detected by the envelope signal detecting section, an amplitude and a phase of the envelope signal to be injected to the distortion signal generating route.

In the above fifth aspect, the amplitude and phase of the envelope signal to be injected to the distortion signal generating route are adjusted in accordance with the level of the envelope signal itself. Here, the level of the envelope signal is changed in accordance with the level of the original signal. Also, the amplitude and phase of the envelope signal to be injected is changed in accordance with the level of the original signal. In view of these, the amplitude and the phase of the envelope signal to be injected are adjusted based on the level of the envelope signal itself so as to have appropriate values, thereby more accurately eliminating the asymmetric characteristic of the distortion signal. This makes it possible to suppress distortion more accurately.

According to a sixth aspect based on the fifth aspect, the second envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion signal is minimum, and adjusts the amplitude and the phase of the envelope signal by using the table.

In the above sixth aspect, with the use of the table provided in advance, the amplitude and phase of the envelope signal to be injected to the distortion signal generating route can be easily determined.

According to a seventh aspect based on the first aspect, the power amplifier further includes:

an envelope component detecting section for detecting a level of envelope components included in an output signal from the amplifying section after injection of the envelope signal and the distortion signal; and a third envelope signal adjusting section for adjusting, based on the level of the envelope components included in the output signal detected by the envelope component detecting section, an amplitude and a phase of the envelope signal to be injected to the signal amplifying route so that the level of the envelope components is minimum.

In the above seventh aspect, based on the envelope components in the signal amplified by the amplifying section, the amplitude and phase of the envelope signal injected to the signal amplifying route are adjusted. This adjustment is performed based on the envelope components of the signal after injection of the envelope signal and the distortion signal. Therefore, even when the values of the amplitude and the phase of the envelope signal are changed for some reason, the amplitude and phase can be adjusted to have appropriate values in accordance with that change. Also, since no table is required, it is possible to construct a power amplifier without the use of a costly memory or storage circuit.

According to an eighth aspect based on the seventh aspect, the third envelope signal adjusting section includes:

a level determining section for determining whether a width of changes in a level of the envelope components is not less than a predetermined value when the phase of the envelope signal is changed by 0 degree to 360 degrees with the amplitude of the envelope signal being fixed;

a phase determining section for determining, when the level determining section determines that the width of changes is not less than the predetermined value, a value as a value of the phase of the envelope signal so that the level of the envelope components is minimum; and a level determining section for determining a value as a value of the amplitude of the envelope signal so that the level of the envelope components is minimum at the phase determined by the phase determining section.

In the above eighth aspect, the amplitude value is first set so that the width of changes in the envelope component level is equal to or larger than the predetermined value. Then, based on the set amplitude value, an optimum phase value is determined. Here, in some cases, an optimum phase value cannot be found depending on the amplitude value of the envelope signal. Therefore, it is inappropriate that the amplitude and phase are simply changed for determining values so that the envelope component level is minimum, because there may be a possibility that the found amplitude value of the envelope signal does not bring an optimum phase value. In the eighth aspect, whether an optimum phase value can be found can be determined by the width of changes in the envelope component level. Therefore, whether an optimum phase value can be found is first determined based on the width of changes in the envelope component level, and then the phase value is determined. With this, it is always possible to determine optimum phase and amplitude values.

According to a ninth aspect based on the first aspect, the power amplifier further includes:

an output signal detecting section for detecting a level of an output signal from the amplifying section after injection of the envelope signal and the distortion signal; and a distortion signal adjusting section for adjusting the distortion signal based on the level of the output signal detected by the output signal detecting section so that the distortion components included in the output signal are minimum.

In the above ninth aspect, this adjustment is performed based on the envelope components of the signal after injection of the envelope signal and the distortion signal. Therefore, even when the values of the amplitude and the phase of the envelope signal are changed for some reason, the amplitude and phase can be adjusted to have appropriate values in accordance with that change. Also, since no table is required, it is possible to construct a power amplifier without the use of a costly memory or storage circuit.

According to a tenth aspect based on the first aspect, the envelope signal generating section generates the envelope signal from the original signal In the above tenth aspect, the envelope signal is generated from the original signal to be amplified. Therefore, according to the tenth aspect, the present invention can be applied to any power amplifier which amplifies a signal including a plurality of signals of different frequencies in order to generate an envelope signal.

According to an eleventh aspect based on the first aspect, the power amplifier further includes a modulating section for generating a modulated signal by using a baseband signal, wherein the signal input section inputs the modulated signal as the original signal, and the envelope signal generating section generates the envelope signal from the baseband signal.

In the above eleventh aspect, the envelope signal is generated from the baseband signal. Therefore, compared with a case where the envelope signal is generated from the original signal, the envelope signal can be accurately generated with respect to any input levels. Consequently, the circuit's dynamic range can be increased.

A twelfth aspect of the present invention is directed to a power amplifier which amplifies an original signal having a prescribed frequency band and being obtained by modulation with a baseband signal. The power amplifier includes:

a baseband signal correcting section for correcting the baseband signal so that a distortion signal for canceling distortion components occurring during amplification is included in the original signal;

a modulating section for generating the original signal by using the baseband signal corrected by the baseband signal correcting section;

a signal input section for inputting the original signal generated by the modulating section;

an amplifying section for amplifying the original signal input from the signal input section;

a signal output section for outputting the signal amplified by the amplifying section to outside of the power amplifier;

an envelope signal generating section for generating, based on the baseband signal, an envelope signal having components identical to envelope components included in the original signal; and an envelope signal injecting section for injecting the envelope signal to a signal amplifying route from the signal input section to the signal output section so as to eliminate an asymmetric characteristic of the distortion components.

In the above twelfth aspect, a process of compensating for distortion for suppressing distortion components occurring at the amplifying section are performed within a baseband signal domain. According to the twelfth aspect, the present invention can also be applied to such a distortion compensating process. Furthermore, in this case, as to the original signal after modulation by the modulating section, frequency components corresponding to the distortion components are equal in level to each other between the low frequency side and the high frequency side. Therefore, by using the envelope signal to eliminate the asymmetric characteristic of the distortion components, a large distortion suppressing effect can be achieved.

According to a thirteenth aspect based on the twelfth aspect, the power amplifier further includes:

an envelope signal detecting section for detecting a level of the envelope signal; and a first envelope signal adjusting section for adjusting, based on the level of the envelope signal detected by the envelope signal detecting section, an amplitude and a phase of the envelope signal to be injected to the signal amplifying route.

According to a fourteenth aspect, based on the thirteenth aspect, the first envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion components is minimum, and adjusts the amplitude and the phase of the envelope signal by using the table.

A fifteenth aspect of the present invention is directed to a power amplifier which amplifies an original signal including a plurality of signals of different frequencies. The power amplifier includes:

a signal input section for inputting the original signal;

an amplifying section for amplifying the original signal input from the signal input section;

a signal output section for outputting the signal amplified by the amplifying section to outside of the power amplifier;

an envelope signal generating section for generating an envelope signal having components identical to envelope components included in the original signal;

a distortion signal generating section for generating, based on the original signal, a distortion signal for canceling distortion components occurring while the original signal is amplified by the amplifying section;

a distortion signal injecting section for injecting the distortion signal to a signal amplifying route from the signal input section to the signal output section so as to suppress the distortion components; and an envelope signal injecting section for injecting the envelope signal to a distortion signal generating route from the signal input section to the distortion signal injecting section so that an asymmetric characteristic of frequency components included in the distortion signal which correspond to the distortion components coincides with an asymmetric characteristic of the distortion components.

In the above fifteenth aspect, the distortion signal is adjusted by the envelope signal so that the level difference between the components at the low frequency side and those at the high frequency side in the frequency components included in the distortion signal that correspond to the distortion components is equal to the level difference between the components at the low frequency side and those at the high frequency side in the distortion components. As such, by using the distortion signal corresponding to the level difference of the distortion components, a large distortion suppressing effect can be achieved.

According to a sixteenth aspect based on the fifteenth aspect, the power amplifier further includes:

an envelope signal detecting section for detecting a level of the envelope signal; and a second envelope signal adjusting section for adjusting, based on the level of the envelope signal detected by the envelope signal detecting section, an amplitude and a phase of the envelope signal to be injected to the distortion signal generating route.

According to a seventeenth aspect based on the fifteenth aspect, the second envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion signal is minimum, and adjusts the amplitude and the phase of the envelope signal by using the table.

According to an eighteenth aspect based on the fifteenth aspect, the power amplifier further includes:

an output signal detecting section for detecting a level of an output signal from the amplifying section after injection of the envelope signal and the distortion signal; and a distortion signal adjusting section for adjusting the distortion signal based on the level of the output signal detected by the output signal detecting section so that distortion components included in the output signal are minimum.

According to a nineteenth aspect based on the fifteenth aspect, the envelope signal generating section generates the envelope signal from the original signal.

According to a twentieth aspect based on the fifteenth aspect, the power amplifier further includes a modulating section for generating a modulated signal by using a baseband signal, wherein the signal input section inputs the modulated signal as the original signal, and the envelope signal generating section generates the envelope signal from the baseband signal.

A twenty-first aspect of the present invention is directed to a method of amplifying an original signal including a plurality of signals of different frequencies. The method includes the steps of:

amplifying the original signal;

generating an envelope signal having components identical to envelope components included in the original signal;

generating, based on the original signal, a distortion signal for canceling distortion components occurring while the original signal is amplified;

injecting the envelope signal to a signal amplifying route from an input end which inputs the original signal to an output end which outputs a signal amplified in the signal amplifying step to outside so as to eliminate an asymmetric characteristic of the distortion components; and injecting the distortion signal to the signal amplifying route so as to suppress the distortion components.

A twenty-second aspect of the present invention is directed to a method of amplifying an original signal which has a prescribed frequency band and is obtained by modulation with a baseband signal. The method includes the steps of:

correcting the baseband signal so that a distortion signal for canceling distortion components occurring during amplification is included in the original signal;

generating the original signal through modulation by using the baseband signal corrected in the baseband signal correcting step;

amplifying the original signal generated in the original signal generating step;

generating, based on the baseband signal, an envelope signal having components identical to envelope components included in the original signal; and injecting the envelope signal to a signal amplifying route from an input end which inputs the original signal to an output end which outputs the signal amplified by the signal amplifying step to outside so as to eliminate an asymmetric characteristic of the distortion components.

A twenty-third aspect of the present invention is directed to a method of amplifying an original signal including a plurality of signals of different frequencies. The method includes the steps of:

amplifying the original signal;

generating, based on the original signal, an envelope signal having components identical to envelope components included in the original signal;

generating, based on the original signal, a distortion signal for canceling distortion components occurring while the original signal is amplified;

injecting the distortion signal to a signal amplifying route from an input end which inputs the original signal to an output end which outputs the signal amplified in the signal amplifying step to outside so as to suppress the distortion components; and injecting the envelope signal to a distortion signal generating route from an input end which inputs the original signal to an end to which the distortion signal is injected so that an asymmetric characteristic of frequency components included in the distortion signal which correspond to the distortion components coincides with an asymmetric characteristic of the distortion components.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are illustrations each showing a spectrum of an input signal and an output signal observed at a distortion generating device 108 illustrated in FIG. 1;

FIG. 9 is a flow chart illustration a flow of a process carried out by the control circuit 144 illustrated in FIG. 8 for determining initial values of an attenuation amount and a phase amount;

DESCRIPTION OF THE PREFERRED EMBODIMENTS

Figure 1:
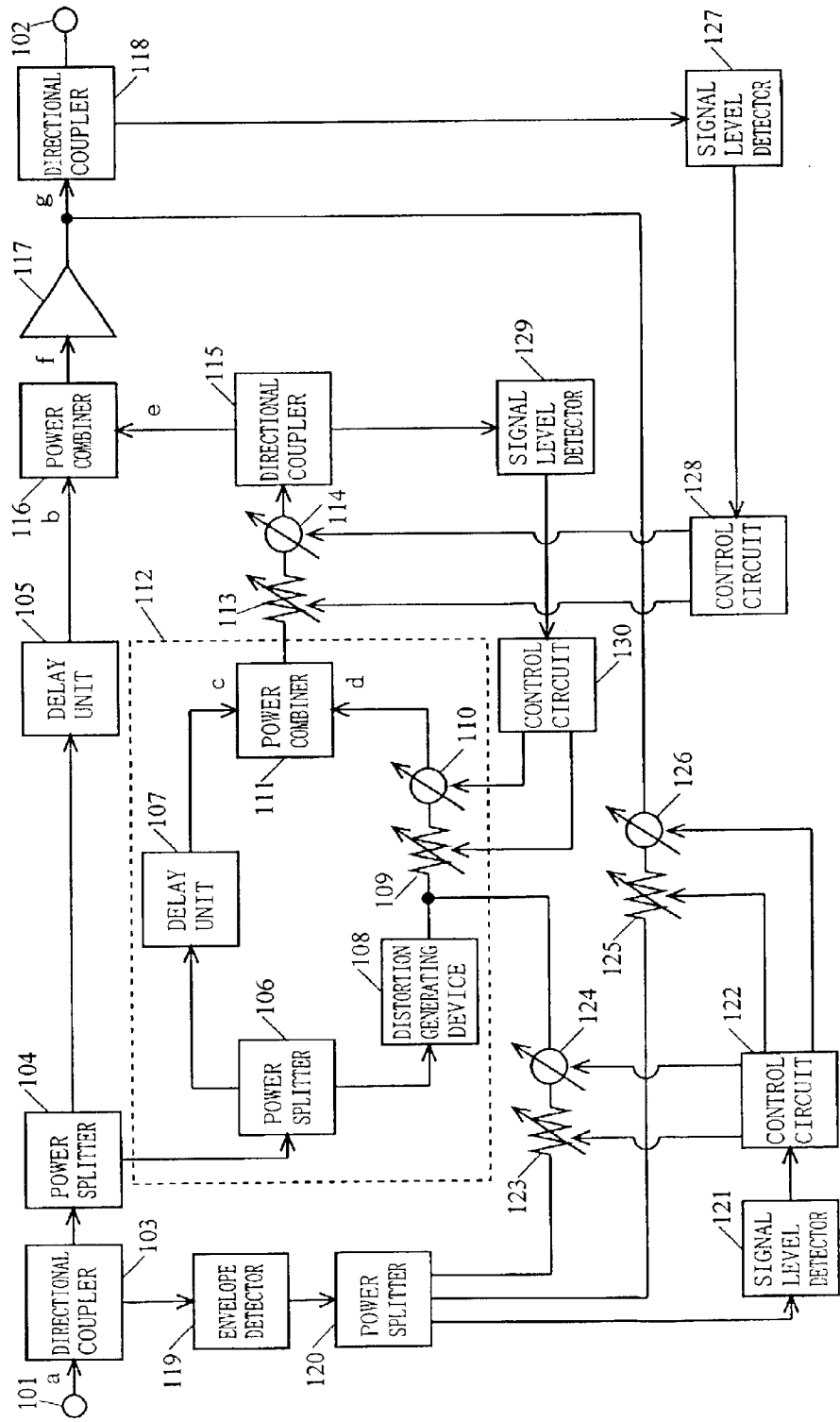
FIG. 1 is a block diagram of a power amplifier according to a first embodiment of the present invention.

Hereinafter, first through fourth embodiments of the present invention are described with reference to the attached drawings. Note that, throughout these embodiments and drawings, the same components are provided with the same reference numerals.

(First Embodiment)

FIG. 1 is a block diagram of a power amplifier according to the first embodiment of the present invention. In FIG. 1, the power amplifier includes an input terminal 101, an output terminal 102, directional couplers 103, 115, and 118, power splitters 104, 106, and 120, delay units 105 and 107, a distortion generating device 108, variable attenuators 109, 113, 123, and 125, variable phase shifters 110, 114, 124, and 126, power combiners 111 and 116, a power amplifying circuit 117, an envelope detector 119, control circuits 122, 128, and 130, and signal level detectors 127 and 129.

The distortion generating device 108 and the power amplifying circuit 117 are each implemented by a transistor, such as a field-effect transistor (FET). Also, the delay units 105 and 107 are each implemented by a coaxial cable, such as a semi-rigid cable. The control circuits 122, 128, and 130 are each implemented by a memory (storage unit), such as ROM.

The distortion signal generating circuit 112 includes a power splitter 106, a delay unit 107, a distortion generating device 108, a variable attenuator 109, a variable phase shifter 110, and a power combiner 111. The distortion signal generating circuit 112 generates a distortion signal based on an original signal. Here, the original signal is a signal composed of carrier components to be amplified by the power amplifier, and is supplied through the input terminal 101. The distortion signal is a signal for canceling distortion components occurring while the original signal is amplified. The distortion signal includes only distortion components occurring at the power amplifying circuit 117.

In FIG. 1, the input terminal 101 is connected to the directional coupler 103. One output end of the directional coupler 103 is connected to the power splitter 104. One output end of the power splitter 104 is connected via the delay unit 105 to one input end of the power combiner 116. The other output end of the power splitter 104, on the other hand, is connected to the power splitter 106. One output end of the power splitter 106 is connected via the delay unit 107 to one input end of the power combiner 111. The other output end of the power splitter 106, on the other hand, is connected via the distortion generating device 108, the variable attenuator 109, and the variable phase shifter 110 to one input end of the power combiner 111. The power combiner 111 is connected via the variable attenuator 113 and the variable phase shifter 114 to the directional coupler 115. One output end of the directional coupler 115 is connected to another input end of the power combiner 116. An output from the power combiner 116 is supplied via the power amplifying circuit 117 and the directional coupler 118 to the output terminal 102.

On the other hand, the other output end of the directional coupler 103 is connected to the envelope detector 119. An output from the envelope detector 119 is supplied to the power splitter 120. The power splitter 120 has first, second, and third output ends. The first output end is connected via the variable attenuator 123 and the variable phase shifter 124 to an output end of the distortion generating device 108. The second output end is connected via the variable attenuator 125 and the variable phase shifter 126 to an output end of the power amplifying circuit 117. The third output end is connected via the control circuit 122 to a control end provided to each of the variable attenuators 123 and 125 and the variable phase shifters 124 and 126.

Also, the other output end of the directional coupler 115 is connected to the signal level detector 129. An output from the signal level detector 129 is supplied via the control circuit 130 to a control end provided to each of the variable attenuator 109 and the variable phase shifter 110. One of two output ends of the directional coupler 118 is connected to the signal level detector 127. An output from the signal level detector 127 is supplied via the control circuit 128 to a control end provided to each of the variable attenuator 113 and the variable phase shifter 114.

The operation of the power amplifier according to the present embodiment is described below. First described is the outline of the operation. The distortion components occurring at the power amplifying circuit 117 illustrated in FIG. 1 while amplifying the original signal have an asymmetric characteristic. That is, of these distortion components, IM3U components (components occurring at high frequency side of the original signal) and IM3L components (components occurring at low frequency side of the original signal) have a level difference. Such an asymmetric characteristic occurs due to envelope components included in the original signal. Therefore, the power amplifier uses an envelope signal of the original signal to eliminate the asymmetric characteristic of the distortion components occurring at the power amplifying circuit 117 while amplifying the original signal. The envelope signal is a signal having envelope components identical to those included in the original signal. By using the envelope signal to cancel these envelope components, which cause the asymmetric characteristic of the distortion components, the asymmetric characteristic can be eliminated. Furthermore, the power amplifier uses a distortion signal to suppress the distortion components after the asymmetric characteristic is eliminated. The distortion signal is a signal generated by the distortion signal generating circuit 112 so that the IM3L components and the IM3U components are equal in level to each other.

Figure 2A:
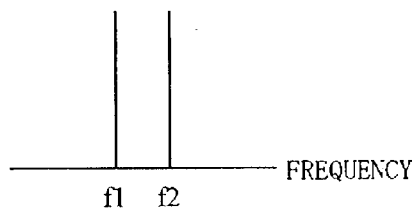
FIGS. 2A, 2B, 2C, 2D, 2E, 2F, and 2G are illustrations each showing a frequency spectrum of a signal observed at some ends of the components of the power amplifier illustrated in FIG. 1.

Next, the operation of the power amplifier is described in detail below. FIGS. 2A through 2G are illustrations each showing a frequency spectrum of a signal observed at some ends of the components of the power amplifier illustrated in FIG. 1. Here, consider a case where the input terminal 101 is supplied with the original signal including two sine-wave (carrier) signals having frequencies of f1 and f2, respectively. The input terminal 101 is taken as an end a (refer to FIG. 1), and a spectrum observed thereat is illustrated in FIG. 2A. The input original signal is split by the directional coupler 103 into two signals.

Figure 2B:
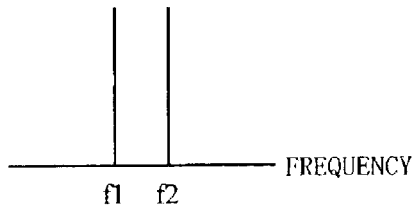

One of these two signals output from the directional coupler 103 is further split by the power splitter 104 into two signals. One of these two signals output from the power splitter 104 is used as the original signal to be amplified by the power amplifying circuit 117. That is, this output signal is supplied via the delay unit 105 to one input end of the power combiner 116. This input end is taken as an end b, and a spectrum observed thereat is illustrated in FIG. 2B. The spectrum at the end b is only of carrier components (f1 and f2), as with the spectrum at the end a. The other of the two signals output from the power splitter 104, on the other hand, is used for generating the above-described distortion signal. That is, this output signal is supplied to the distortion signal generating circuit 112. The operation of the distortion signal generating circuit 112 for generating the distortion signal is described further below.

The other of the two signals output from the directional coupler 103, on the other hand, is used for generating the above-described envelope signal. This output signal is envelope-detected by the envelope detector 119. That is, the envelope detector 119 outputs envelope components included in the original signal (frequency components of the difference between two carriers). Here, a signal output from the envelope detector 119 as the envelope components included in the original signal is the above-described envelope signal. The envelope signal is a signal indicative of the envelope components of the original signal.

The envelope signal generated by the envelope detector 119 is split by the power splitter 120 into three signals. Hereinafter, these three signals obtained by the power splitter 120 are referred to as first, second, and third envelope signals. The first envelope signal is injected via the variable attenuator 123 and the variable phase shifter 124 to the output end of the distortion generating device 108. The second envelope signal is injected via the variable attenuator 125 and the variable phase shifter 126 to the output end of the power amplifying circuit 117. The third envelope signal is supplied to the signal level detector 121. The signal level detector 121 detects a signal level of the third envelope signal. Based on the signal level detected by the signal level detector 121, the control circuit 122 controls the amplitude and phase of each of the first and second envelope signals. The operation of the control circuit 122 is described further below.

Figure 2C:
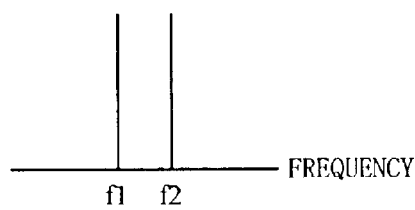
Figure 16:
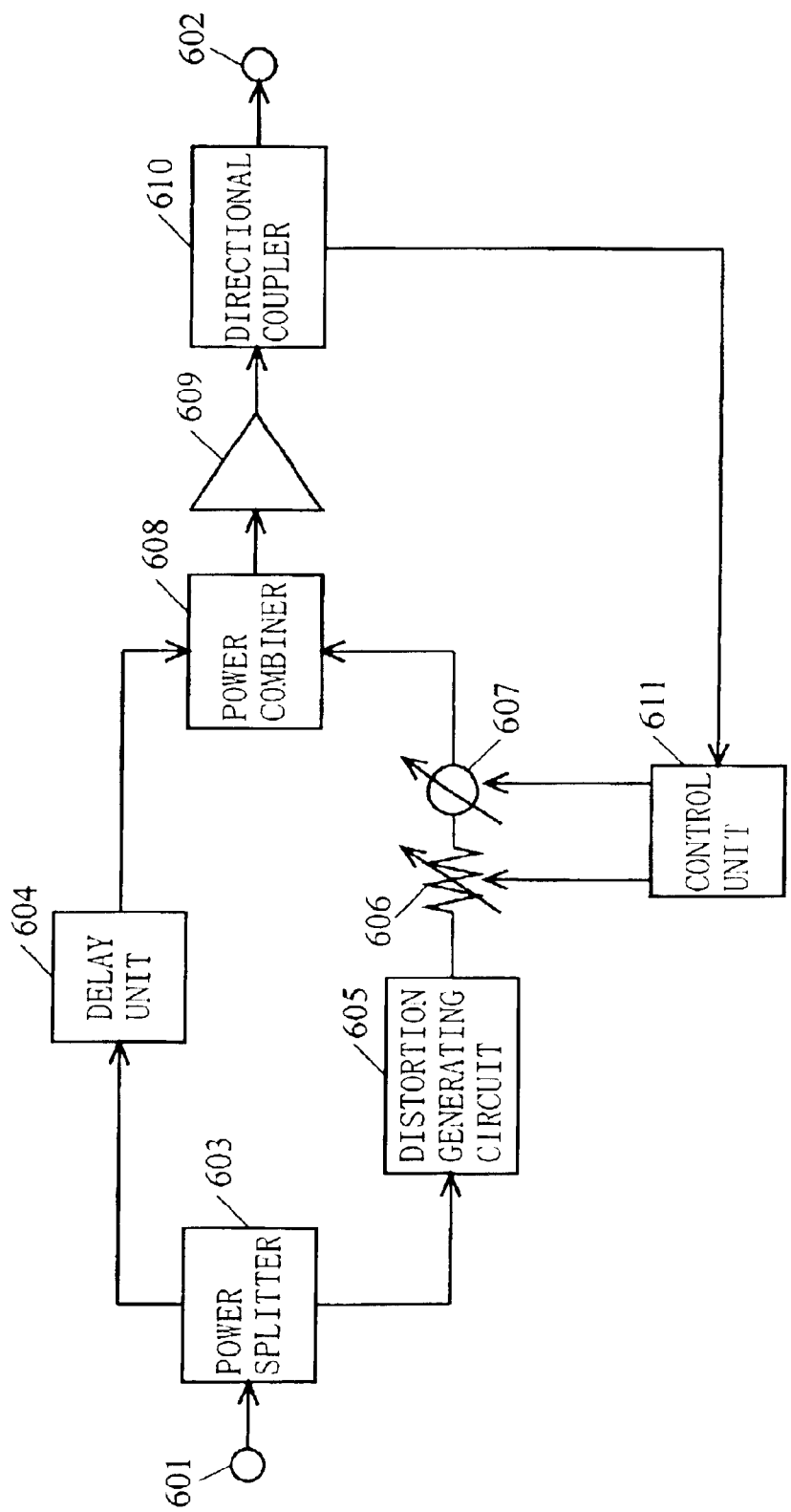
FIG. 16 is a block diagram illustrating the configuration of a conventional power amplifier.

The operation of the distortion signal generating circuit 112 for generating the distortion signal is described below. The configuration of the distortion signal generating circuit 112 is similar to that illustrated in FIG. 16, except that the envelope signal is injected to the output end of the distortion generating device 108. The signal supplied to the distortion signal generating circuit 112 is further split by the power splitter 106 into two signals. One of these two signals output from the power splitter 106 passes through the delay unit 107 to be input to one input end of the power combiner 111. This end is taken as an end c, and a spectrum observed thereat is illustrated in FIG. 2C. The spectrum at the end c is only of the carrier components (f1 and f2), as with the spectrum at the end a. The other of the two signals output from the power splitter 106, on the other hand, is supplied to the distortion generating device 108. Based on the received original signal, the distortion generating device 108 generates IM3 components (distortion components). Here, frequencies of the IM3 components are of f3 (low frequency side) and f4 (high frequency side). That is, outputs from the output stage of the distortion generating device 108 are the distortion signal including the distortion components (f3 and f4) as well as the original signal including the carrier components (f1 and f2).

Here, the signals output from the distortion generating device 108 is injected with the above-described first envelope signal. This is in order to equate levels of IM3L components (the frequency of f3) and the IM3U components (the frequency of f4) included in the signal output from the distortion generating device 108. This operation is described in detail below.

FIGS. 3A and 3B are illustrations each showing a spectrum of an input signal and an output signal observed at the distortion generating device 108 illustrated in FIG. 1. As illustrated in FIG. 3A, when the envelope signal is not injected to the distortion generating device 108, a difference of approximately 3 dB occurs between the frequencies of f3 and f4 of the IM3 components generated by the distortion generating device 108. This difference is caused by the envelope components included in the original signal supplied to the distortion generating device 108. Here, by injecting the envelope signal to the distortion generating device 108, it is possible to eliminate the asymmetric characteristic of the IM3 components that occurs due to the envelope components. Also, with such injection of the envelope signal, the distortion characteristic of the signal to be generated by the distortion generating device 108, that is, the difference in level of the IM3 components, is changed. Specifically, depending on the amplitude and phase of the injected envelope signal, the distortion characteristic of the signal to be generated by the distortion generating device 108 is changed. Therefore, as illustrated in FIG. 3B, by injecting the envelope signal having a predetermined amplitude and a predetermined phase to the distortion generating device 108, the IM3L components and the IM3U components occurring at the distortion generating device 108 can be made approximately equal in level to each other, thereby eliminating the asymmetric characteristic of the IM3 components. The envelope signal having the predetermined amplitude and the predetermined phase is a signal equal in amplitude and opposite in phase to the envelope components of the signal to be generated by the distortion generating device 108. In the present embodiment, the control circuit 122 uses the variable attenuator 123 and the variable phase shifter 124 to adjust the amplitude and phase of the first envelope signal. A scheme for adjusting the predetermined amplitude and phase is described in detail further below.

Figure 2D:
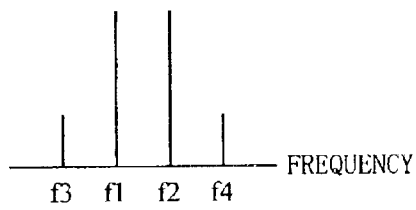

The signal output from the distortion generating device 108 is injected with the envelope signal as describe above, and is then adjusted in amplitude and phase by the variable attenuator 109 and the variable phase shifter 110, respectively. The amplitude- and phase-adjusted signal is supplied to another input end of an input stage of the power combiner 111. This end is taken as an end d, and a spectrum observed thereat is illustrated in FIG. 2D. The spectrum at the end d includes carrier components (f1 and f2) and IM3 components (f3 and f4). The power combiner 111 combines an input from the end c and an input from the end d together for output.

Here, the variable attenuator 109 and the variable phase shifter 110 are controlled by the control circuit 130 so that the carrier components (f1 and f2) of the signal at the end c are equal in amplitude and opposite in phase to the carrier components of the signal at the end d. As a result, the carrier components are suppressed at an output stage of the power combiner 111, and only the IM3 components (f3 and f4) are output therefrom. That is, only the distortion signal is output from the power combiner 111. In this way, the distortion signal is generated by the distortion signal generating circuit 112.

The distortion signal output from the distortion signal generating circuit 112 is adjusted in amplitude and phase by the variable attenuator 113 and the variable phase shifter 114, respectively. The variable attenuator 113 and the variable phase shifter 114 are adjusted so that the adjusted distortion signal is equal in amplitude and opposite in phase to the IM3 components occurring while the original signal is amplified by the power amplifying circuit 117 and having the asymmetric characteristic eliminated by the envelope signal. The amplitude- and phase-adjusted distortion signal is then split by the directional coupler 115 into two signals. One of these two distortion signals obtained by the directional coupler 115 is supplied to the signal level detector 129. The signal level detector 129 detects a signal level of the received distortion signal. The control circuit 130 generates a control voltage corresponding to the signal level detected by the signal level detector 129 to control the variable attenuator 109 and the variable phase shifter 110. Specifically, the control circuit 130 uses the variable attenuator 109 and the variable phase shifter 110 to adjust the amplitude and phase of the signal output from the distortion generating device 108 so that the signal level detected by the signal level detector 129 becomes as minimum as possible. With this, as described above, the output signal is adjusted so that its carrier components are equal in amplitude and opposite in phase to the carrier components of the signal at the end c.

Figure 2E:
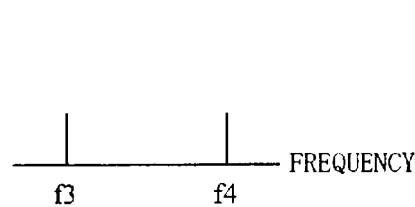
Figure 2F:
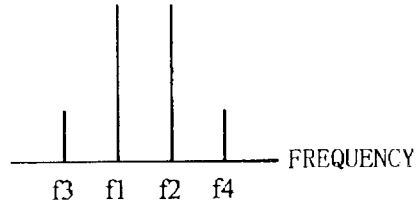

The other of the two signals obtained by the directional coupler 115 is supplied to the power combiner 116. With this, the original signal is injected with the distortion signal. An end provided to the power combiner 116 to be supplied with this distortion signal is taken as an end e, and a spectrum observed thereat is illustrated in FIG. 2E. As evident from FIG. 2E, the distortion signal at the end e having only the distortion components is generated at the terminal e. Note that, in the spectrum illustrated in FIG. 2E, the IM3L components and the IM3U components are approximately equal in level to each other. The distortion signal supplied to the power combiner 116 is combined with the original signal supplied through the end b for output from an end f provided to the power combiner 116. A spectrum observed at the end f is illustrated in FIG. 2F. As illustrated in FIG. 2F, the spectrum at the end f includes carrier components (f1 and f2) and distortion components (f3 and f4).

The signal obtained by the power combiner 116 is supplied to the power amplifying circuit 117. Here, the variable attenuator 113 and the variable phase shifter 114 are adjusted so that the adjusted distortion signal is equal in amplitude and opposite in phase to the IM3 components occurring while the original signal is amplified by the power amplifying circuit 117 and having the asymmetric characteristic eliminated by the envelope signal. As a result, at the output stage of the power amplifying circuit 117, IM3 components occurring due to factors other than the envelope components are suppressed. As such, by supplying the original signal combined with the distortion signal to the power amplifying circuit 117, the IM3 components occurring due to factors other than the envelope components can be suppressed. At this stage, however, the asymmetric characteristic of the IM3 components that occurs due to the envelope components have not yet been eliminated.

Furthermore, the signal output from the power amplifying circuit 117 is injected with the above-described second envelope signal. This is in order to eliminate the asymmetric characteristic of the IM3 components that occur while the power amplifying circuit 117 amplifies the received signal, the asymmetric characteristic occurring due to the envelope components. This operation is described in detail below.

Figure 4A:
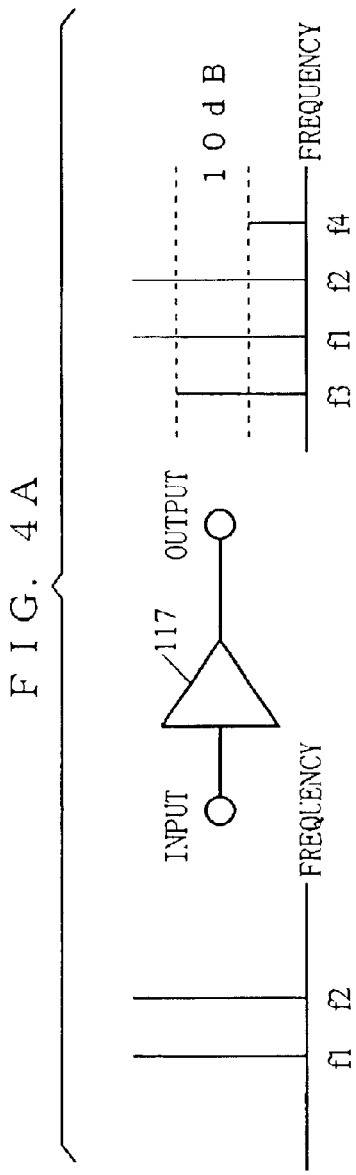
FIGS. 4A and 4B are illustrations each showing a spectrum of an input signal and an output signal observe data power amplifying circuit 117 illustrated in FIG. 1.
Figure 4B:
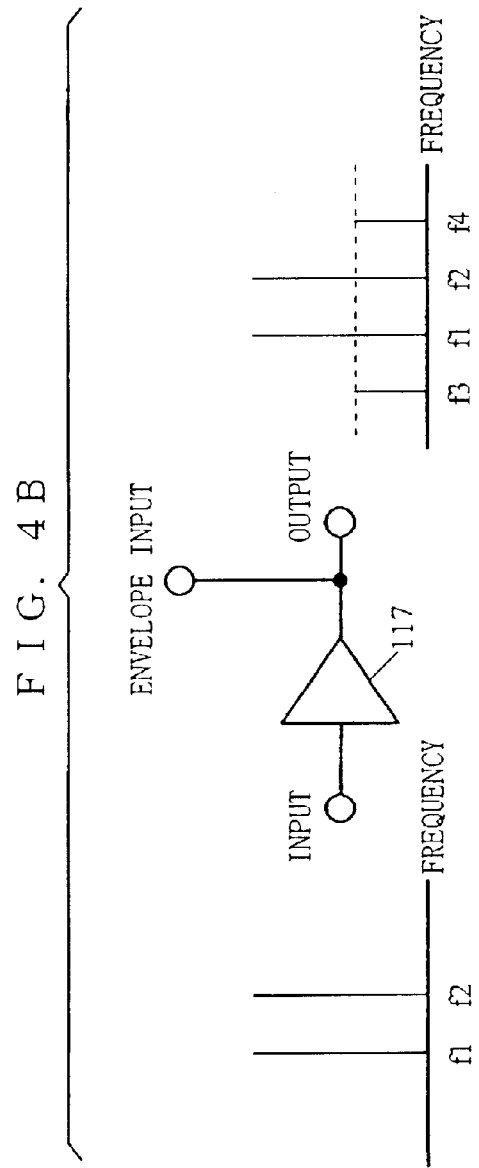

FIGS. 4A and 4B are illustrations each showing a spectrum of an input signal and an output signal at the power amplifying circuit 117 illustrated in FIG. 1. As illustrated in FIG. 4A, when the envelope signal is not injected to the power amplifying circuit 117, a difference of approximately 10 dB occurs between the frequencies of f3 and f4 included in the IM3 components occurring at the power amplifying circuit 117. This difference is caused by the envelope components of the original signal supplied to the power amplifying circuit 117. Here, by injecting the envelope signal to the power amplifying circuit 117, it is possible to eliminate the asymmetric characteristic of the IM3 components that occurs due to the envelope components. Also, with such injection of the envelope signal, the distortion characteristic of the signal to be generated by the power amplifying circuit 117, that is, the difference in level of the IM3 components, is changed. Specifically, depending on the amplitude and phase of the envelope signal, the distortion characteristic of the signal to be generated by the power amplifying circuit 117 is changed. Therefore, as illustrated in FIG. 4B, by injecting the envelope signal having a predetermined amplitude and a predetermined phase to the power amplifying circuit 117, the components occurring due to the envelope components can be suppressed, thereby the IM3 components (f3 and f4) occurring at the power amplifying circuit 117 can be made approximately equal in level to each other. The envelope signal having the predetermined amplitude and the predetermined phase is a signal equal in amplitude and opposite in phase to the envelope components of the signal to be generated by the power amplifying circuit 117. In the present embodiment, the control circuit 122 uses the variable attenuator 125 and the variable phase shifter 126 to adjust the amplitude and phase of the second envelope signal. A scheme for adjusting these predetermined amplitude and phase is described in detail further below.

Figure 2G:
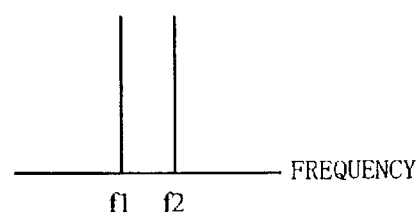

In the present embodiment, as described above, the signal supplied to the power amplifying circuit 117 includes the distortion signal having the IM3 components as well as the original signal having the carrier components (refer to FIG. 2F). Of the IM3 components occurring at the power amplifying circuit 117 while amplifying the received signal, those occurring due to factors other than the envelope components are therefore suppressed by the distortion signal. Furthermore, as illustrated in FIG. 4B, the distortion signal also eliminates the asymmetric characteristic occurring due to the envelope components. As such, with the distortion signal and the envelope signal, a large distortion suppressing effect can be produced on the IM3 components occurring at the power amplifying circuit 117. An end located subsequently to a stage where the signal output from the power amplifying circuit 117 is injected with the envelope signal is taken as an end g, and a spectrum observed thereat is illustrated in FIG. 2G.

The signal output from the power amplifying circuit 117 is injected with the second envelope signal, and is then split by the directional coupler 118 into two signals. One of these two signals output from the directional coupler 118 is output outside of the power amplifier from the output terminal 102. The other thereof is supplied to the signal level detector 127. The signal level detector 127 detects a level of the received signal. The control circuit 128 generates a control voltage corresponding to the signal level detected by the signal level detector 127 to control the variable attenuator 113 and the variable phase shifter 114. This is in order to adjust the distortion signal to be injected in accordance with changes, if any, of the operating point of the power amplifying circuit 117 that have occurred for some reason. Specifically, based on the signal level detected by the signal level detector 127, the control circuit 128 adjusts the distortion signal so that the IM3 components included in the signal supplied to the signal level detector 127 become minimum. In the present embodiment, the control circuit 128 stores a table containing a correspondence between a possible signal level to be detected by the signal level detector 127, and an optimum value of an attenuation amount of the variable attenuator 113 and an optimum value of a phase amount of the variable phase shifter 114. That is, with the signal level detected by the signal level detector 127, the control circuit 128 can detect that the operating point of the power amplifying circuit 117 has been changed, thereby adjusting the distortion signal to have an amplitude and a phase corresponding to the signal level. Note that the above table is created in advance based on experiments and simulations. As such, even if the operating point (output power level) of the power amplifying circuit 117 has been changed, it is possible to control, in accordance with the changes, the amplitude and phase of the distortion signal to be supplied to the power amplifying circuit 117 so that the amplitude and phase are optimum.

Next, a control scheme carried out by the control circuit 122 is described in detail below. First, a scheme for controlling the first envelope signal, that is, a scheme of controlling the variable attenuator 123 and the variable phase shifter 124, is described. As described above, the control circuit 122 controls the variable attenuator 123 and the variable phase shifter 124 based on the signal level (signal level of the third envelope signal) detected by the signal level detector 121. Specifically, the control circuit 122 stores a table containing a correspondence between a possible value of the envelope signal level, and a value to be set as the attenuation amount of the variable attenuator 123 and a value to be set as the phase amount of the variable phase shifter 124. Referring to this table, the control circuit 122 determines a value as the above attenuation amount of the variable attenuator 123 and a value as the above phase amount of the variable phase shifter 124. The table indicates a correspondence between a possible level of the first envelope signal detected by the signal level detector 121, and an amplitude and a phase of the first envelope signal when the low frequency components and the high frequency components in the IM3 components included in the signal output from the distortion generating device 108 have a minimum level difference therebetween. Here, the table is created in advance based on experiments and simulations. A scheme of creating the above table is described in detail below.

Figure 5:
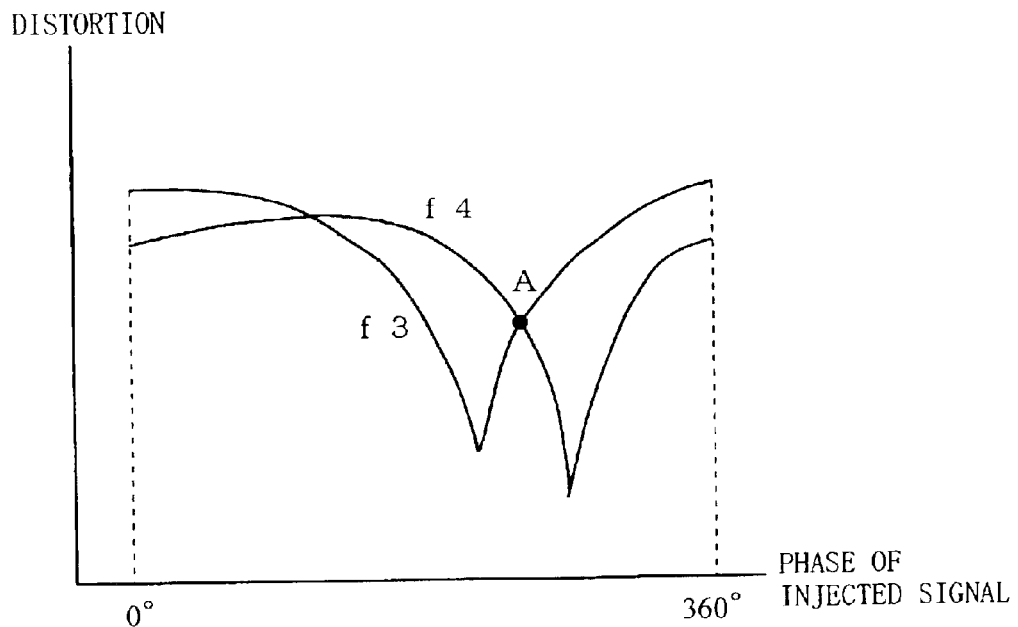
FIG. 5 is an illustration showing a relation between distortion occurring at the distortion generating device 108 illustrated in FIG. 1 and the phase (injection phase) of an envelope signal injected to the distortion generating device 108.
Figure 6:
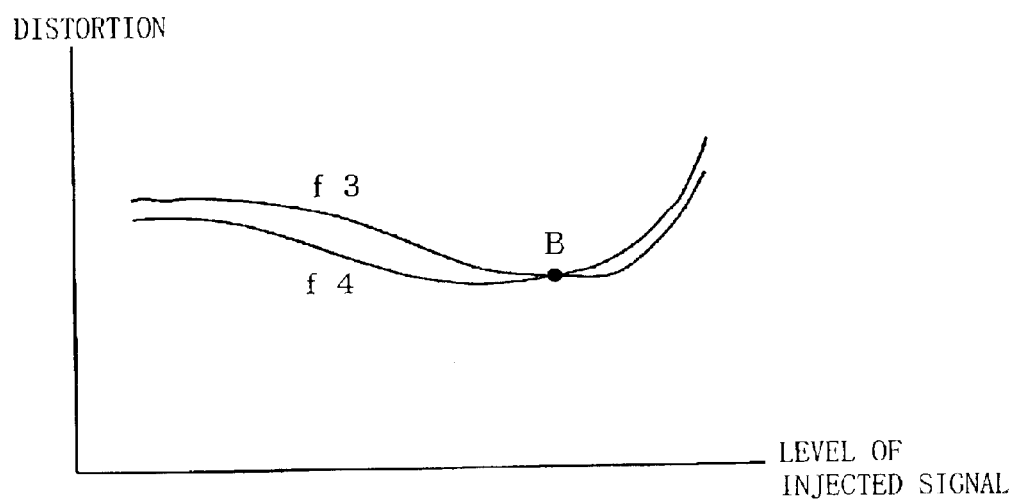
FIG. 6 is an illustration showing a relation between the distortion occurring at the distortion generating device 108 illustrated in FIG. 1 and the level (injection level) of the envelope signal injected to the distortion generating device 108.

FIG. 5 is an illustration showing a relation between the distortion occurring at the distortion generating device 108 illustrated in FIG. 1 and the phase (injection phase) of the envelope signal injected to the distortion generating device 108. FIG. 6 is an illustration showing a relation between the distortion occurring at the distortion generating device 108 illustrated in FIG. 1 and the level (injection level) of the envelope signal injected to the distortion generating device 108. As illustrated in FIG. 5, the relation between the distortion occurring at the distortion generating device 108 and the injection phase shows different characteristics with respect to the IM3L components (frequency of f3) and the IM3U components (frequency of f4). Here, the injection phase is adjusted so as to have a value of an intersection point (point A) of the characteristics of the IM3L components and those of the IM3U components, thereby making the IM3L and IM3U components equal in level to each other. Similarly, the injection level is adjusted so as to have a value of an intersection point (point B) of the characteristics of the IM3L components and those of the IM3U components, thereby making the IM3L and IM3U components equal in level to each other.

Figure 7:
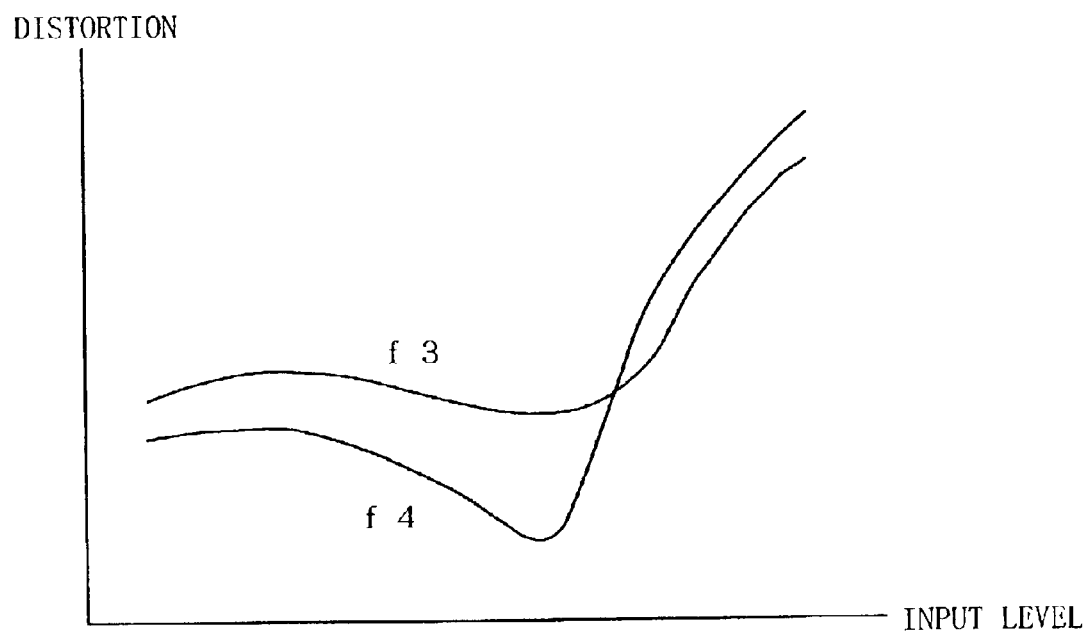
FIG. 7 is an illustration showing a relation between the distortion occurring at the distortion generating device 108 illustrated in FIG. 1 and the input level of the signal supplied to the distortion generating device 108.

FIG. 7 is an illustration showing a relation between the distortion occurring the distortion generating device 108 illustrated in FIG. 1 and the input level of the signal supplied to the distortion generating device 108. As the input level of the signal supplied to the distortion generating device 108 is changed, the characteristics illustrated in the graphs of FIGS. 5 and 6 are also changed. Therefore, as illustrated in FIG. 7, as the input level of the signal supplied to the distortion generating device 108 is changed, the amount of distortion occurring at the distortion generating device 108 is also changed and, accordingly, the intersection points A and B illustrated in FIGS. 5 and 6 are also changed. That is, when the input level of the signal supplied to the distortion generating device 108 is changed, the values to be set as the injection level and the injection phase are also changed. Also, the control circuit 122 detects a change in the input level by the level of the envelope signal. As such, in the present embodiment, the control circuit 122 uses a table containing a correspondence between a possible level of the envelope signal, and a value to be set as the injection level and a value to be set as the injection phase, thereby determining the injection level and the injection phase. The table is created in advance based on experiments and simulations.

Next, a scheme for controlling the second envelope signal, that is, a scheme of controlling the variable attenuator 125 and the variable phase shifter 126, is described below. Also in the scheme for controlling the second envelope signal, a relation similar to that shown in FIGS. 5, 6, and 7 can be observed. Therefore, as with the scheme for controlling the first envelope signal, the scheme for controlling the second envelope signal uses a table containing a correspondence between a possible level of the envelope signal, and a value to be set as the injection level and a value to be set as the injection phase, thereby determining the injection level and the injection phase. The table indicates a correspondence between a possible level of the second envelope signal detected by the signal level detector 121, and an amplitude and a phase of the first envelope signal when the low frequency components and the high frequency components in the IM3 components included in the signal output from the power amplifying circuit 117 have a minimum level difference therebetween. In this case, the table is created in advance based on experiments and simulations.

(Second Embodiment)

Figure 8:
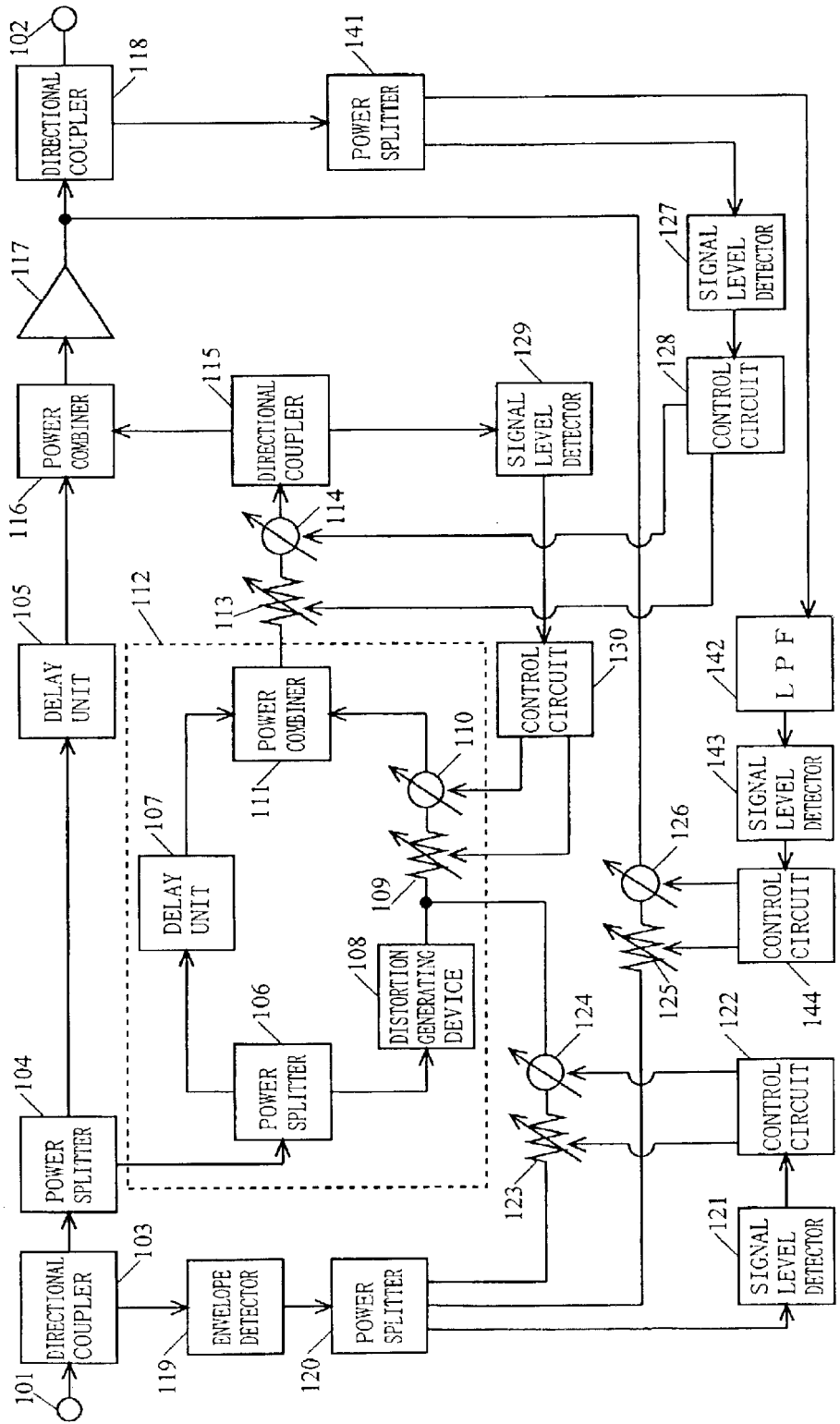
FIG. 8 is a block diagram of a power amplifier according to a second embodiment of the present invention.

The second embodiment of the present invention is described below. FIG. 8 is block diagram of a power amplifier according to the second embodiment of the present invention. As described above, in the second embodiment, components identical to those of the first embodiment are provided with the same reference numerals. Also, the operations of these identical components are the same as those of the first embodiment. Therefore, only the differences from the first embodiment are described below.

The second embodiment is different from the first embodiment in that the output from the directional coupler 118 is supplied via a low-pass filter (LPF) 142 and a signal level detector 143 to a control circuit 144. Specifically, in the first embodiment, one of two outputs from the directional coupler 118 is directly supplied to the signal level detector 127. In the second embodiment, on the other hand, one of two outputs from the directional coupler 118 is supplied to the power splitter 141, and then one of two outputs from the power splitter 141 is supplied to the signal level detector 127. The other of the two outputs from the power splitter 141 is supplied via the low-pass filter 142 and the signal level detector 143 to the control circuit 144. Furthermore, an output from the control circuit 144 is supplied to the variable attenuator 125 and the variable phase shifter 126 each at their control end. The operations of the signal level detector 127 and the control circuit 130 are the same as those in the first embodiment, and therefore are not described herein.

Hereinafter, the operation after the signal is supplied from the power splitter 141 to the low-pass filter 142 is described in detail below.

From out of the signal output from the power splitter 141, the low-pass filter 142 extracts components in the low frequency domain, that is, envelope components. With this, only the distortion components (envelope components) occurring in the low frequency domain at the power amplifying circuit 117 can be extracted. The signal level detector 143 detects a signal level of the envelope components extracted by the low-pass filter 142. The detected signal level is supplied to the control circuit 144. The control circuit 144 generates a control voltage corresponding to the signal level detected by the signal level detector 143 to control the variable attenuator 125 and the variable phase shifter 126 with that control voltage. Specifically, the control circuit 144 adjusts the attenuation amount of the variable attenuator 125 and the phase amount of the variable phase amount so that the signal level detected by the signal level detector 143 is minimum. A process carried out by the control circuit 144 for determining the attenuation amount and the phase amount is described below.

First, a process carried out by the control circuit 144 for determining initial values of the attenuation amount and the phase amount is described below. FIG. 9 is a flow chart showing a flow of this process carried out by the control circuit 144 illustrated in FIG. 8. The process shown in FIG. 9 is started by the control circuit 144 first receiving information indicative of the signal level from the signal level detector 143. First, the control circuit 144 sets a level (injection level) and a phase (injection phase) of the envelope signal to be injected to the power amplifying circuit 117 to predetermined values (step S1). Here, these predetermined values are arbitrary.

Subsequent to step S1, the control circuit 144 changes the injection phase by 0 degree to 360 degrees to read out level changes of the envelope components (step S2). Specifically, the control circuit 144 changes the phase value of the variable phase shifter 126 by 0 degree to 360 degrees, and then stores each signal level supplied by the signal level detector 143. The control circuit 144 then determines whether the signal level of the envelope components has been changed by a value equal to or larger than a value predetermined in advance (step S3). Specifically, the control circuit 144 first refers to the signal levels stored in step S2 to calculate a difference between a maximum value and a minimum value of these signal levels. If the calculated value is equal to or larger than the predetermined value, it is determined that the signal level of the envelope components has been changed by a value equal to or larger than the predetermined value. On the other hand, if the calculated value is smaller than the predetermined value, it is determined that the signal level of the envelope components has not been changed by a value equal to or larger than the predetermined value. To which value the predetermined value should be set is described further below. With the processes in the above steps S2 and S3, it is possible to determine whether the injection level has an appropriate value, which is described in detail below.

Figure 10:
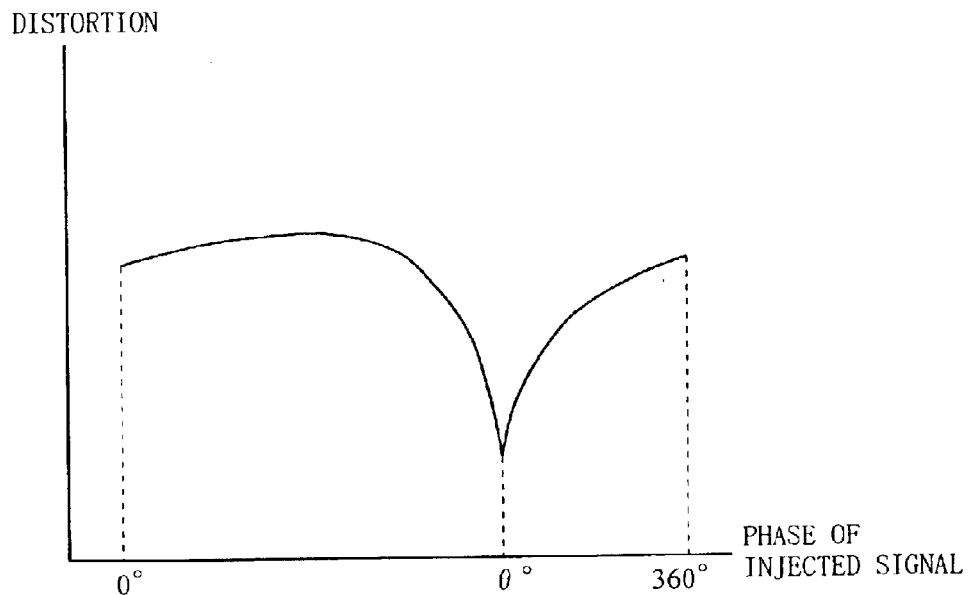
FIG. 10 is an illustration showing a relation between the level of envelope components occurring at a power amplifying circuit 117 illustrated in FIG. 8 and the phase (injection phase) of an envelope signal injected to a power amplifying circuit 117.
Figure 11:
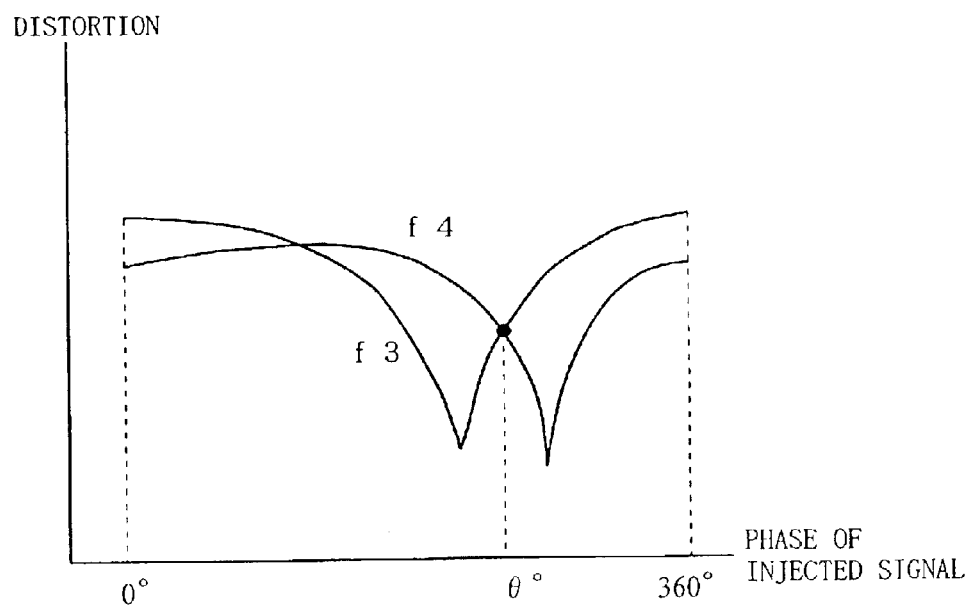
FIG. 11 is an illustration showing a relation between the level of the IM3 components occurring at the power amplifying circuit 117 illustrated in FIG. 8 and the injection phase of a signal injected to the power amplifying circuit 117.

FIG. 10 is an illustration showing a relation between the level of envelope components occurring at the power amplifying circuit 117 illustrated in FIG. 8 and the phase (injection phase) of the envelope signal injected to the power amplifying circuit 117. FIG. 11 is an illustration showing a relation between the level of the IM3 components occurring at the power amplifying circuit 117 illustrated in FIG. 8 and the injection phase of the signal injected to the power amplifying circuit 117. In the above step S2, the minimum value and the maximum value of the envelope component level in the characteristics illustrated in FIG. 10 are read. Then, in the above step S3, the width of changes in the envelope component level is determined. That is, whether the difference between the maximum value and the minimum value is equal to or larger than the predetermined value is determined. Here, by detecting the width of changes in the envelope component level illustrated in FIG. 10, the width of changes in the IM3 component level illustrated in FIG. 11 can be calculated. Also, the characteristics illustrated in FIGS. 10 and 11 are changed depending on the injection level of the envelope signal. That is, as the injection level of the envelope signal is increased, the widths of changes in the envelope component level and the IM3 component level are increased. As the injection level of the envelope signal is decreased, on the other hand, these widths of changes is decreased.

Figure 12:
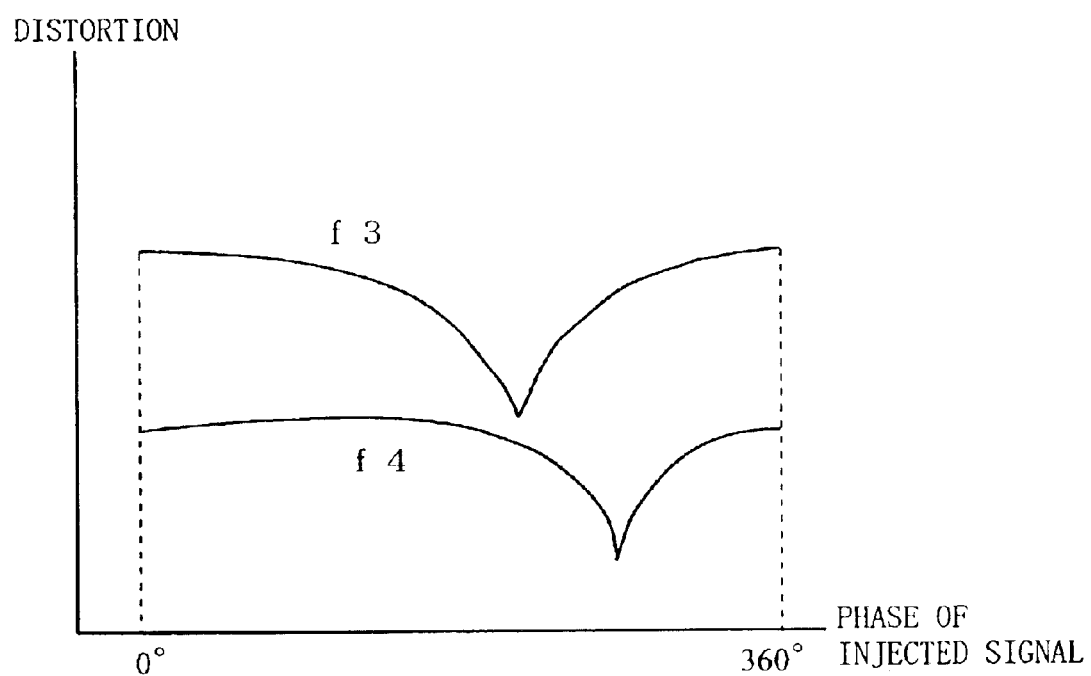
FIG. 12 is an illustration showing characteristics of the relation shown in FIG. 11 when the width of changes in the level of the IM3 components is narrow.

Here, in the characteristics illustrated in FIG. 11, when the width of changes in the IM3 component level is narrow, a curve indicative of a characteristic of the IM3L components (frequency of f3) and a curve indicative of a characteristic of the IM3U components (frequency of f4) do not have an intersection point, as illustrated in FIG. 12. In the case of FIG. 12, no matter how the injection phase is changed, the IM3L components and the IM3U components do not become equal in level. That is, when the width of changes in the IM3 component level is narrow, the control circuit 144 should determine that the width of changes in the IM3 component level is too narrow, that is, the injection level is too low. As described above, the width of changes in the IM3 component level can be obtained from the width of changes in the envelope component level. Therefore, based on the width of changes in the envelope component level, the control circuit 144 determines whether the injection level is too low. As such, when the width of changes in the envelope component level is equal to or smaller than the predetermined value, the control circuit 144 determines that the injection level is too low. Here, the predetermined value is set so that the characteristic of the IM3L components and that of the IM3U component have an intersection point. Also, the predetermined value is calculated in advance based on experiments, for example.

Referring back to FIG. 9, if it is determined in step S3 that the signal level of the envelope components has not been changed by a value smaller than the predetermined value, the control circuit 144 increases the injection level (step S4). Specifically, the control circuit 144 controls the variable attenuator 125 so that the injection level is increased by, for example, 1 dB. After step S4, the control circuit 144 performs the process in step S2, repeating a series of processes from steps S2 through S4 until it is determined that the injection level has an appropriate value.

If it is determined in step S3 that the signal level of the envelope components has been changed by a value equal to or larger than the predetermined value, the control circuit 144 determines a value as the value of the injection phase of the envelope signal (step S5). Here, in FIGS. 10 and 11, a value θ of the injection phase when the envelope component level is minimum is equal to a value of the injection phase when the IM3L components and the IM3U components are equal in level to each other. This is because the envelope components of the signal supplied to the power amplifying circuit 117 cause the level difference between IM3L components and the IM3U components occurring at the power amplifying circuit 117. Therefore, the control circuit 144 determines the value (θ in FIG. 10) when the envelope component level is minimum as the value of the injection phase, thereby making the IM3L components and the IM3U components equal in level to each other.

After determining the injection phase, the control circuit 144 determines an injection level of the envelope signal (step S6). Specifically, the control circuit 144 uses the variable attenuator 125 to change only the injection level, and then detects a level of the signal supplied by the signal level detector 143. Then, the control circuit 144 determines a value when the detected signal level is minimum as the injection level. Finally, the control circuit 144 finely adjusts the injection phase and the injection level (step S7), and then ends the processing. A reason for fine adjustment is that the change of the injection level made in step S6 may possibly change the appropriate value of the injection phase. As such, the injection phase and the injection level are adjusted within the vicinity of the values determined in steps S5 and S6, respectively, thereby more accurately calculating the appropriate values. With these processes from steps S1 through S7, the control circuit 144 determines initial values of the attenuation amount of the variable attenuator 125 and the phase amount of the variable phase shifter 126.

After determining the initial values, the control circuit 144 controls the variable attenuator 125 and the variable phase shifter 126 in accordance with changes in power output from the power amplifying circuit 117. Specifically, when a change in power output from the power amplifying circuit 117 is detected, the control circuit 144 first changes the injection level, that is, the attenuation amount of the variable attenuator 125. Since the signal level detected by the signal level detector 143 is changed in accordance with the change in power output from the power amplifying circuit 117, the control circuit 144 determines, as the value of the injection level, a value so that the signal level is minimum. The control circuit 144 then changes the injection phase, that is, the phase amount of the variable phase shifter 126 to determine, as the value of the injection phase, a value so that the signal level detected by the signal level detector 143 is minimum.

As described above, in the present embodiment, the amplitude and phase of the envelope signal to be injected to the output end of the power amplifying circuit 117 are adjusted based on the signal output from the power amplifying circuit 117. With this, in the power amplifier according to the present embodiment, the envelope signal to be injected to the output end of the power amplifying circuit 117 can be controlled on a real time basis. Also, the power amplifier according to the present embodiment does not require a table for controlling the variable attenuator 125 and the variable phase shifter 126 in accordance with the input level. Consequently, a control speed can be increased, and no costly memory or large-scale storage circuit is required.

In the above second embodiment, the initial values of the injection level and the injection phase are determined by following the processes shown in the flow chart of FIG. 9. Alternatively, in other embodiments, the initial values can be determined by using a table created in advance. Specifically, the envelope components occurring at the power amplifying circuit 117 are measured in advance for each input level. Based on the measurement results, a table indicative of a correspondence between the input levels, and the attenuation amount of the variable attenuator 125 and phase amount of the variable phase shifter 126 is created. The created table is stored in the control circuit 144 for use in determining the initial values.

(Third Embodiment)

Figure 13:
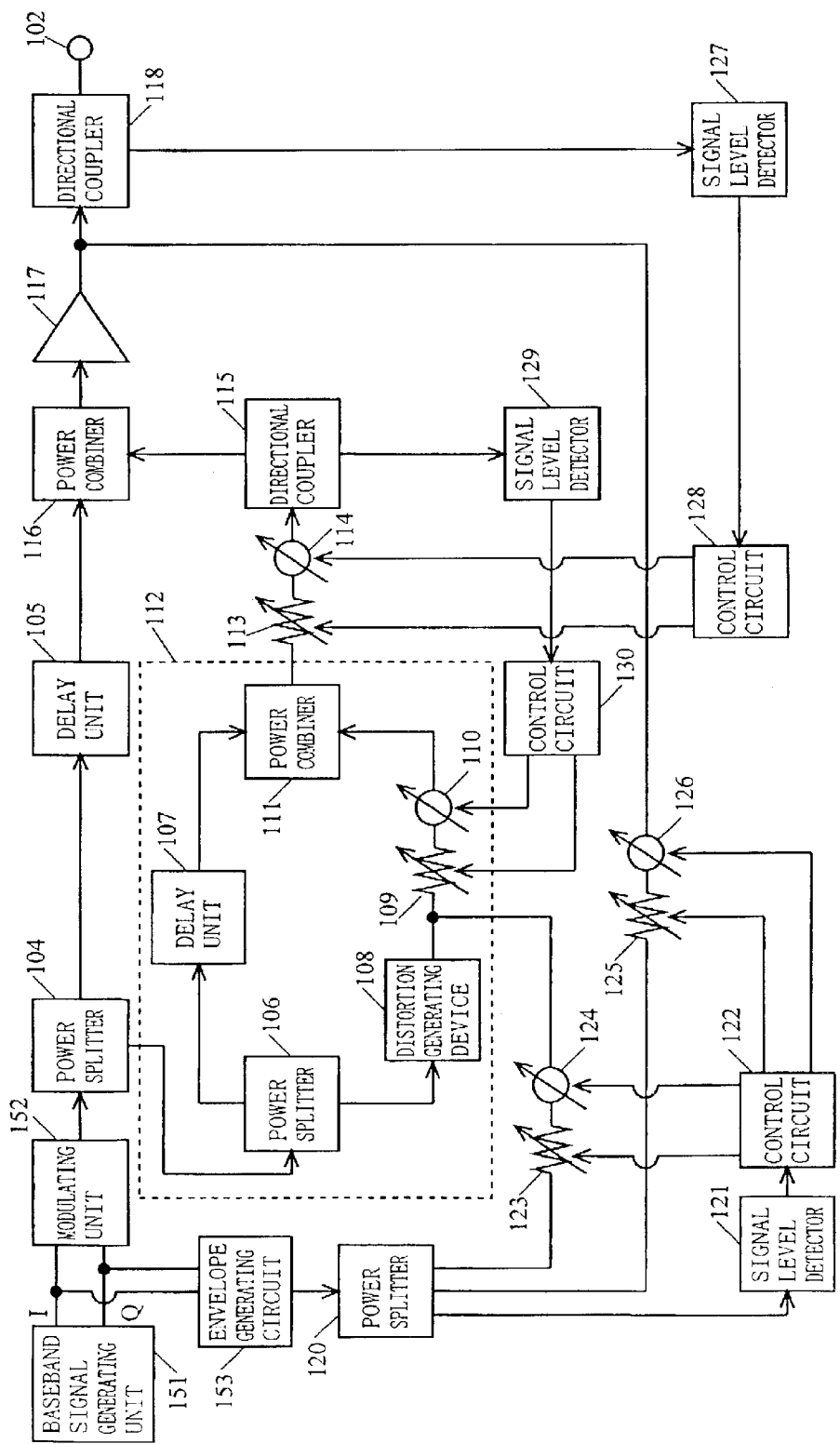
FIG. 13 is a block diagram of a power amplifier according to a third embodiment of the present invention.

The third embodiment of the present invention is described below. FIG. 13 is a block diagram of a power amplifier according to the third embodiment of the present invention. As described above, in FIG. 13, components identical to those in the first embodiments are provided with the same reference numerals in FIG. 1. Also, the operations of these identical components are the same as those in the first embodiment. Therefore, only the differences from the first embodiment are described below.

The third embodiment is different from the first embodiment in that the envelope signal is generated from a baseband signal. That is, in the first embodiment, the envelope signal is generated by the envelope detector 119 based on a high-frequency signal supplied through the input terminal 101. In the third embodiment, on the other hand, the envelope components of the original signal are generated directly from the baseband signal.

A baseband signal generating unit 151 generates and outputs I signal and Q signal (collectively referred to as an IQ signal), which form a baseband signal. The output IQ signal is split into two signals, one being supplied to a modulating unit 152 and the other being supplied to an envelope generating circuit 153. The IQ signal supplied to the modulating unit 152 is used for quadrature modulation to generate a modulated signal. In the present embodiment, the modulating unit 152 has an output end which corresponds to one of the output ends of the directional coupler 103 in the first and second embodiments. Therefore, in the present embodiment, this modulated signal is the original signal, and is amplified by the power amplifying circuit 117. The IQ signal supplied to the envelope generating circuit 153, on the other hand, is converted to an envelope signal indicative of envelope components of the original signal, which is the signal output from the modulating unit 152. In the present embodiment, the envelope generating circuit 153 has an output end which corresponds to the output end of the envelope detector 119 in the first and second embodiments. The operation subsequent to the output from the modulating unit 152 and the output from the envelope generating circuit 153 is the same as that of the first embodiment.

As described above, in the present embodiment, the envelope signal is generated from the baseband signal before modulation to become the modulated signal (original signal). In this case, compared with a case where the envelope signal is generated from the original signal, the envelope signal can be accurately generated with respect to any input levels. Consequently, the circuit's dynamic range can be increased.

In the present embodiment, as with the first embodiment, the variable attenuator 125 and the variable phase shifter 126 are controlled by using the envelope signal generated from the input signal. In other embodiments, as with the second embodiment, the variable attenuator 125 and the variable phase shifter 126 can be controlled by using the envelope components of the signal output from the directional coupler 118. In this case, effects similar to those in the second embodiment can be achieved.

(Fourth Embodiment)

Figure 14:
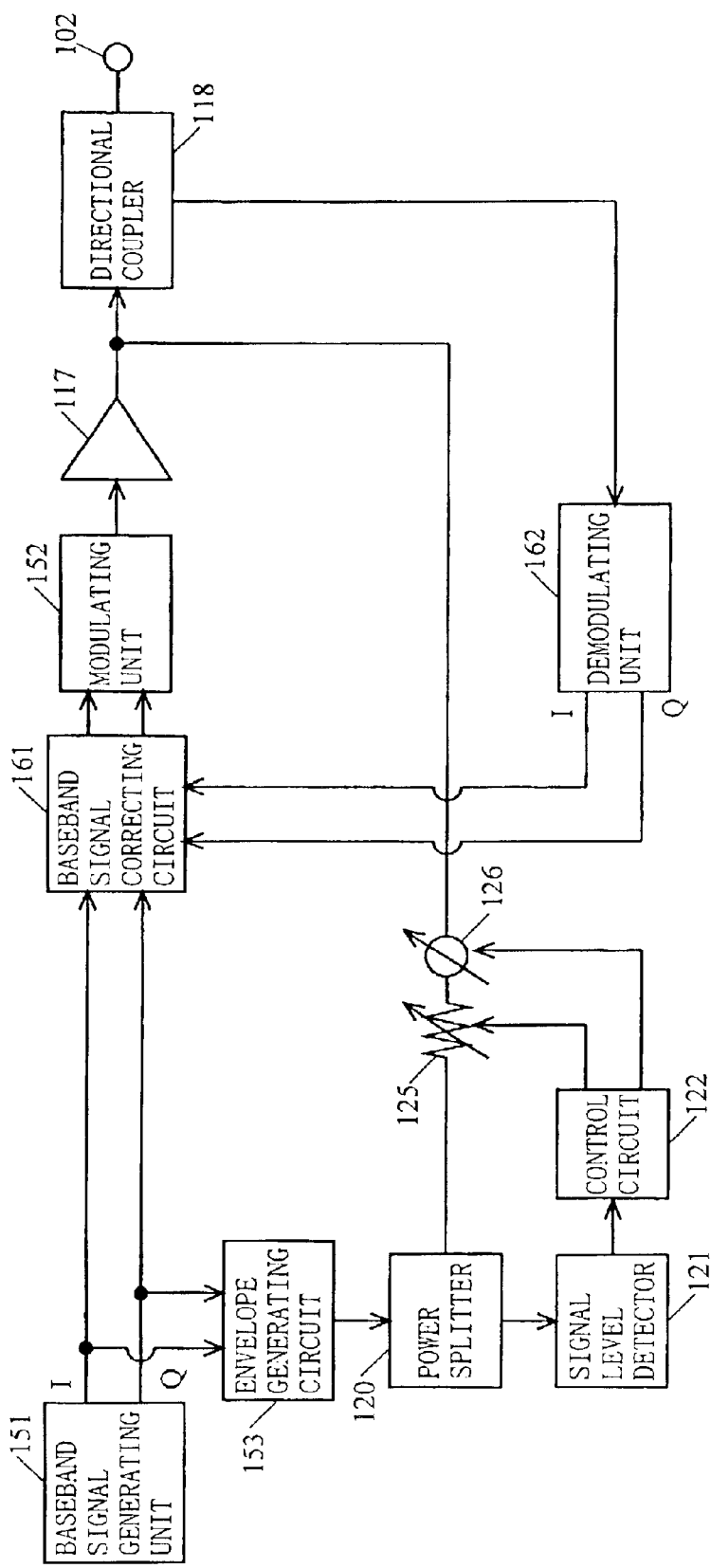
FIG. 14 is a block diagram of a power amplifier according to a fourth embodiment of the present invention.

The fourth embodiment of the present invention is described below. FIG. 14 is a block diagram of a power amplifier according to the fourth embodiment of the present invention. As described above, in FIG. 14, components identical to those in the first or third embodiment are provided with the same reference numerals in FIG. 1 or 13. Also, the operations of these identical components are the same as those in the first or third embodiment. Therefore, only the differences from the first or third embodiment are described below.

The fourth embodiment is different from the first through third embodiments in that a process of suppressing distortion is performed within a baseband signal domain. That is, in the first through third embodiments, the distortion signal is generated by using the distortion signal generating circuit 112, and is then injected to the signal supplied to the power amplifying circuit 117, thereby suppressing distortion within a high frequency signal domain. In the present embodiment, on the other hand, an IQ signal is generated by demodulating the output from the directional coupler 118, and is then injected to a baseband signal correcting circuit 161, thereby suppressing distortion within the baseband signal domain. Note that, of the IM3 components occurring at the power amplifying circuit 117, components caused by the envelope components are suppressed by using the envelope signal, as with the first through third embodiments.

In the power amplifier according to the present embodiment, the IQ signal output from the baseband signal generating unit 151 is split into two signals, one being supplied to the baseband signal correcting circuit 161 and the other being supplied to the envelope generating circuit 153. The IQ signal supplied to the envelope generating circuit 153 is converted to an envelope signal indicative of the envelope components of the signal output from the modulating unit 152. The operation thereafter is the same as that in the first embodiment.

Figure 15:
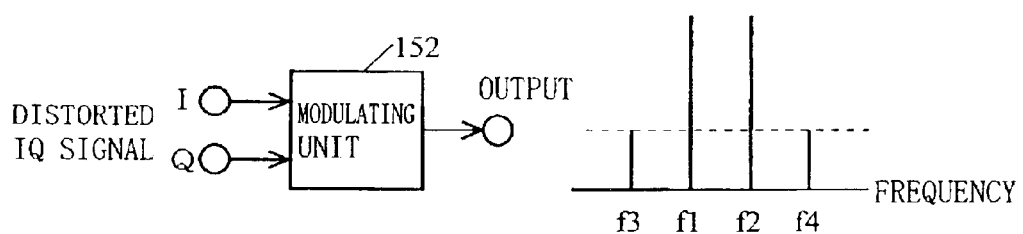
FIG. 15 is an illustration showing an input/output relation at a modulating unit 152 illustrated in FIG. 14.

The IQ signal supplied to the baseband signal correcting circuit 161, on the other hand, is corrected so as to cause distortion while the IQ signal is used by the modulating unit 152 for modulation to generate the original signal. That is, the baseband signal correcting circuit 161 corrects the received IQ signal so that a distortion signal for canceling distortion components occurring at the time of amplification in the power amplifying circuit 117 is included in the original signal. Hereinafter, the IQ signal corrected by the baseband signal correcting circuit 161 is referred to as a distorted IQ signal. The modulating unit 152 performs quadrature modulation with the distorted IQ signal, and then outputs the modulated signal, that is, the original signal. FIG. 15 is an illustration showing an input/output relation at the modulating unit 152 illustrated in FIG. 14. As illustrated in FIG. 15, when the distorted IQ signal is supplied to the modulating unit 152, the spectrum of the original signal output includes IM3 components (f3 and f4). Here, the IM3L components and the IM3U components are always equal in level to each other. Also, the distortion components are generated by the modulating unit 152 so as to be equal in amplitude and opposite in phase to distortion components occurring while a signal which does not include the distortion components to be generated by the modulating unit 152 is amplified by the power amplifying circuit 117. As such, the signal output from the modulating unit 152 is similar to the signal output from the power combiner 116 in the first embodiment. That is, the signal output from the modulating unit 152 is a signal obtained by combining the original signal obtained from the baseband signal generated by the baseband signal generating unit 151 and the distortion signal in the first embodiment together. The baseband signal correcting circuit 161 converts the IQ signal so as to cause the signal obtained by combining the above original signal and the distortion signal to be generated by the modulating unit 152.

The original signal obtained by modulation at the modulating unit 152 is amplified by the power amplifying circuit 117. The output signal from the power amplifying circuit 117 is injected with the envelope signal. With this, the level difference in the IM3 components included in the output signal is suppressed. Part of the output signal injected with the envelope signal is extracted by the directional coupler 118, and is then supplied to the demodulating unit 162. The demodulating unit 162 demodulates the output from the power amplifying unit 117 to an IQ signal. The baseband signal correcting circuit 161 compares the IQ signal obtained by demodulation with the IQ signal supplied by the baseband signal generating unit 151 and, based on the comparison result, changes the IQ signal to be output, if necessary.

As described above, of the IM3 components occurring at the power amplifying circuit 117, components other than those caused by the envelope components can be suppressed within the baseband domain. In this case, the IM3L components and the IM3U components of the signal output from the modulating unit 152 are always equal in level to each other. Therefore, unlike the first through third embodiments, the distortion generating device 108 does not require injection of the envelope signal. In the fourth embodiment, effects similar to those in the first embodiment can be achieved.

In the present embodiment, as with the first embodiment, the variable attenuator 125 and the variable phase shifter 126 are controlled by using the envelope signal generated from the input signal. In other embodiments, as with the second embodiment, the variable attenuator 125 and the variable phase shifter 126 can be controlled by using the envelope components of the signal output from the directional coupler 118. In this case, effects similar to those in the second embodiment can be achieved.

As described in the foregoing, according to the first through fourth embodiments, the envelope signal is injected to the power amplifying circuit 117, thereby suppressing the IM3 components caused by the envelope components included in the original signal. Therefore, it is possible to eliminate the level difference between the IM3L components and the IM3U components included in the IM3 components occurring at the power amplifying circuit 117. As such, with the above level difference being eliminated, distortion is compensated by using the distortion signal. Therefore, a large distortion suppressing effect can be produced on both of the IM3L and IM3U components.

Furthermore, in the first through third embodiments, the envelope signal is injected to the distortion generating device 108, thereby making the IM3L and IM3U components included in the distortion signal equal in level to each other. With this, it is possible to eliminate the level difference between the IM3L and IM3U components included in the signal output from the distortion generating device 108. Therefore, the distortion signal generating circuit 112 can generate a distortion signal having almost no level difference between the IM3L and IM3U components, thereby eliminating the asymmetric characteristic of the IM3 components of the distortion signal. As described above, in the first through fourth embodiments, the envelope signal is injected to the power amplifying circuit 117, thereby suppressing the IM3 components caused by the envelope components included in the original signal. Therefore, it can be thought that the IM3 components to be suppressed by injecting the distortion signal have almost no level difference between the IM3L and the IM3U components. Thus, by making the IM3L components and the IM3U components of the distortion signal equal in level to each other, a larger distortion suppressing effect can be achieved.

Still further, in the first through third embodiment, the envelope signal is injected to both of the distortion generating device 108 and the power amplifying circuit 117. Alternatively, when the level difference between the IM3L components and the IM3U components is small, the envelope signal may be injected only to the power amplifying circuit 117.

Still further, the envelope signal may be injected only to the distortion generating device 108. As illustrated in FIG. 5, by controlling the injection level and the injection phase, it is possible to freely adjust the level difference between the IM3L components and the IM3U components included in the signal output from the distortion generating device 108. Therefore, with the envelope signal being injected, the asymmetric characteristic of the frequency components included in the distortion signal that correspond to the distortion components occurring at the power amplifying circuit 117 can coincide with the asymmetric characteristic of the distortion components. That is, the output signal from the distortion generating device 108 can be adjusted so as to have a level difference equal to the level difference between the IM3L components and the IM3U components occurring at the power amplifying circuit 117. Specifically, the distortion generating device 108 generates a signal including components equal in amplitude and opposite in phase to the IM3U and IM3L components occurring at the power amplifying circuit 117. With this, the IM3U and IM3L components occurring at the power amplifying circuit 117 can be suppressed. In the first through third embodiments, the envelope signal is injected to the distortion generating device 108 in order to eliminate the asymmetric characteristic of the IM3 components of the signal output from the distortion generating device 108. Alternatively, as described above, the envelope signal can be injected to the distortion generating device 108 so that the asymmetric characteristic of the IM3 components of the signal output from the distortion generating device 108 coincides with the asymmetric characteristic of the IM components of the signal from the power amplifying circuit 117.

Still further, in the above first through fourth embodiments, the envelope signal is injected to the output end of each of the distortion generating device 108 and the power amplifying circuit 117. Alternatively, the envelope signal injected in these embodiments to the output end of the power amplifying circuit 117 may be injected to any point on a route for signal amplification, the route being from an input of the original signal to an output of the signal amplified by the power amplifying circuit 117 to outside of the power amplifier. By way of example, in other embodiments, the envelope signal can be injected to the input end of the power amplifying circuit 117 or to a power supply end at an input or output side. Note that the power splitter 104 and the delay unit 105 have to be placed preceding the injection point, and that the directional coupler 118 has to be placed subsequently to the injection point. Furthermore, the envelope signal injected in the present embodiments to the output end of the distortion generating device 108 may be injected to any point on a route for distortion signal generation, the route being from an input of the original signal to an injection of a signal generated by the distortion generating device 108 to the power amplifying circuit 117. By way of example, in other embodiments, the envelope signal can be injected to the input end of the distortion generating device 108 or to a power supply end at an input or output side. Note that the power splitter 106 has to be placed preceding the injection point, and that the directional coupler 115 has to be placed subsequently to the injection point. With this, effects similar to the present embodiments can also be achieved. Note that the end from which the envelope signal is injected to the distortion generating device 108 is not necessarily the same as that from which the envelope signal is injected to the power amplifying circuit 117.

Still further, in the above first through third embodiments, the signal level detector 129 is supplied with only the output signal from the directional coupler 115. Alternatively, in other embodiments, the signal level detector 129 can be supplied with the output signal from the directional coupler 118 as well as the output signal from the directional coupler 115. With this, effects similar to those in the above first through third embodiments can be achieved.

Still further, in the above first through third embodiments, the signal level detector 127 detects the level of the entire signal. Also, the control circuit 128 uses the table created in advance to determine the attenuation amount of the variable attenuator 113 and the phase amount of the variable phase shifter 114. Alternatively, in other embodiments, the signal level detector 127 may detect the level of the IM3 components of the signal, and the control circuit 128 may control the variable attenuator 113 and the variable phase shifter 114 so that the level of the IM3 components becomes as minimum as possible. By way of example, the control circuit 128 increases the attenuation amount of the variable attenuator 113. If the level of the IM3 components detected by the signal level detector 127 becomes increased, the attenuation amount is then decreased. Conversely, if the IM3 components detected by the signal level detector 127 becomes decreased, the attenuation amount is then increased. By repeating this process, the control circuit 128 can control the variable attenuator 113 so that the level of the IM3 components is as minimum as possible. This control scheme can also be employed by the control circuit 130.

Still further, in the above first through fourth embodiments, the distortion generating device 108 and the power amplifying circuit 117 are each implemented by an FET. Alternatively, both can be each implemented by a bipolar transistor. Furthermore, the distortion generating device 108 can also be implemented by a diode. With this, effects similar to those in the above embodiments can also be achieved. Still further, in the above embodiments, the delay units 105 and 107 are each implemented by a coaxial cable, such as a semi-rigid cable. Alternatively, these units can be each implemented by another transmission line, such as a microstrip line, or by a delay filter. Also, the delay units 105 and 107 are not meant to be restricted to delay units with their propagation delay time being fixed, as used in the above embodiments. Alternatively, the delay units 105 and 107 can be each implemented by a delay unit, such as a variable delay filter, which is capable of changing the delay time.

While the invention has been described in detail, the foregoing description is in all aspects illustrative and not restrictive. It is understood that numerous other modifications and variations can be devised without departing from the scope of the invention.

What is claimed is:

1. A power amplifier which amplifies an original signal including a plurality of signals of different frequencies, the power amplifier comprising:
   a signal input section for inputting the original signal;
   an amplifying section for amplifying the original signal input from the signal input section;
   a signal output section for outputting the signal amplified by the amplifying section to outside of the power amplifier;
   an envelope signal generating section for generating an envelope signal having components identical to envelope components included in the original signal;
   a distortion signal generating section for generating, based on the original signal, a distortion signal for canceling distortion components occurring while the original signal is amplified by the amplifying section;
   a first envelope signal injecting section for injecting the envelope signal to a signal amplifying route from the signal input section to the signal output section so as to eliminate an asymmetric characteristic of the distortion components; and
   a distortion signal injecting section for injecting the distortion signal to the signal amplifying route so as to suppress the distortion components.

2. The power amplifier according to claim 1, further comprising:
   an envelope signal detecting section for detecting a level of the envelope signal; and
   a first envelope signal adjusting section for adjusting, based on the level of the envelope signal detected by the envelope signal detecting section, an amplitude and a phase of the envelope signal to be injected to the signal amplifying route.

3. The power amplifier according to claim 2, wherein
   the first envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion components is minimum, and adjusts the amplitude and the phase of the envelope signal by using the table.

4. The power amplifier according to claim 1, further comprising:
   a second envelope signal injecting section for injecting the envelope signal to a distortion signal generating route from the signal input section to the distortion signal injecting section so as to eliminate an asymmetric characteristic of frequency components included in the distortion signal that correspond to the distortion components.

5. The power amplifier according to claim 4, further comprising:
   an envelope signal detecting section for detecting a level of the envelope signal; and
   a second envelope signal adjusting section for adjusting, based on the level of the envelope signal detected by the envelope signal detecting section, an amplitude and a phase of the envelope signal to be injected to the distortion signal generating route.

6. The power amplifier according to claim 5, wherein
   the second envelope signal adjusting section stores in advance a table indicative of a correspondence between a possible level of the envelope signal to be detected by the envelope signal detecting section, and an amplitude and a phase of the envelope signal when a level difference between low frequency components and high frequency components included in the distortion signal is minimum, and adjusts the amplitude and the phase of the envelope signal by using the table.

7. The power amplifier according to claim 1, further comprising:
   an envelope component detecting section for detecting a level of envelope components included in an output signal from the amplifying section after injection of the envelope signal and the distortion signal; and
   a third envelope signal adjusting section for adjusting, based on the level of the envelope components included in the output signal detected by the envelope component detecting section, an amplitude and a phase of the envelope signal to be injected to the signal amplifying route so that the level of the envelope components is minimum.

8. The power amplifier according to claim 7, wherein the third envelope signal adjusting section includes:
- a level determining section for determining whether a width of changes in a level of the envelope components is not less than a predetermined value when the phase of the envelope signal is changed by 0 degree to 360 degrees with the amplitude of the envelope signal being fixed;
- a phase determining section for determining, when the level determining section determines that the width of changes is not less than the predetermined value, a value as a value of the phase of the envelope signal so that the level of the envelope components is minimum; and
- a level determining section for determining a value as a value of the amplitude of the envelope signal so that the level of the envelope components is minimum at the phase determined by the phase determining section.

9. The power amplifier according to claim 1, further comprising:

- an output signal detecting section for detecting a level of an output signal from the amplifying section after injection of the envelope signal and the distortion signal; and
- a distortion signal adjusting section for adjusting the distortion signal based on the level of the output signal detected by the output signal detecting section so that the distortion components included in the output signal are minimum.

10. The power amplifier according to claim 1, wherein the envelope signal generating section generates the envelope signal from the original signal.

11. The power amplifier according to claim 1, further comprising a modulating section for generating a modulated signal by using a baseband signal, wherein the signal input section inputs the modulated signal as the original signal, and the envelope signal generating section generates the envelope signal from the baseband signal.

\* \* \* \* \*